(12) United States Patent
Kawahara et al.

(10) Patent No.: US 7,596,014 B2
(45) Date of Patent: Sep. 29, 2009

(54) SEMICONDUCTOR DEVICE

(75) Inventors: Takayuki Kawahara, Higashiyamoto (JP); Riichiro Takemura, Tokyo (JP); Kenchi Ito, Kunitachi (JP); Hiromasa Takahashi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 176 days.

(21) Appl. No.: 11/736,252

(22) Filed: Apr. 17, 2007

(65) Prior Publication Data
US 2007/0285975 A1    Dec. 13, 2007

(30) Foreign Application Priority Data
May 18, 2006 (JP) ............... 2006-138429

(51) Int. Cl.
*G11C 11/00* (2006.01)
(52) U.S. Cl. .................. 365/158; 365/171; 365/173
(58) Field of Classification Search .............. 365/158, 365/171, 173, 149
See application file for complete search history.

(56) References Cited

U.S. PATENT DOCUMENTS

| | | | | |
|---|---|---|---|---|
| 7,224,601 B2 * | 5/2007 | Panchula | ............ | 365/158 |
| 7,286,395 B2 * | 10/2007 | Chen et al. | ............ | 365/158 |
| 7,382,643 B2 * | 6/2008 | Ashida et al. | ............ | 365/158 |
| 2005/0117392 A1 | 6/2005 | Hayakawa et al. | | |

FOREIGN PATENT DOCUMENTS

JP     2005-116923     4/2005

OTHER PUBLICATIONS

"A Novel Nonvolatile Memory with Spin Torque Transfer Magnetization Switching: Spin-Ram" by M. Hosomi, et al, IEEE 2005.

* cited by examiner

*Primary Examiner*—David Lam
(74) *Attorney, Agent, or Firm*—Mattingly & Malur, P.C.

(57) ABSTRACT

In a memory using spin transfer torque, state of the spin is made unstable by applying a weak pulse before rewriting to reduce rewrite current. Reading of high-speed operation is performed with current in a regime where the current becomes non-linearly increases corresponding to the pulse width to suppress disturb. Further, fluctuation of respective memory cells is suppressed by a driving method setting the amount of spin constant by bit line charge to suppress read disturb.

11 Claims, 31 Drawing Sheets

P → AP

AP → P

SEMICONDUCTOR DEVICE

CROSS-REFERENCE TO RELATED APPLICATION

The present application claims priority from Japanese Patent Application No. JP 2006-138429 filed on May 18, 2006, the content of which is hereby incorporated by reference into this application.

TECHNICAL FIELD OF THE INVENTION

The present invention relates to a semiconductor device, and in particular, to a method for controlling writing to a memory cell utilizing magnetoresistive change.

BACKGROUND OF THE INVENTION

Of non-volatile memories, MRAM (magnetoresistive random access memory) utilizing magnetoresistance change has a possibility that it serves as RAM capable of high-speed operation. A cell arrangement of a conventional MRAM is composed of one tunneling magnetoresistance TMR and a select transistor MCT for read operation, a write word line WWL and a bit line BL, and a source line SL. As shown in FIG. 30, the tunneling magnetoresistance TMR includes at least two magnetic layers, one thereof being a fixed layer PL where a direction of spin is fixed while the other is a free layer FL where a direction of spin takes two states of a parallel state and an anti-parallel state to the fixed layer. Storage of information or data is performed according to the direction of spin in the free layer, where electric resistance of the tunneling magnetoresistance changes to a high resistance state in the anti-parallel state while it changes to a low resistance state in the parallel state. In a read operation, magnitude (large/small) of resistance of the tunneling magnetoresistance TMR is read. On the other hand, in a rewrite operation, current is caused to flow in the write word line WWL and the bit line BL, so that the direction of spin in the free layer is controlled at the time by synthetic magnetic field excited in the tunneling magnetoresistance TMR. In the rewrite system, however, the tunneling magnetoresistance TMR is made fine and the magnitude of magnetic field required for rewrite operation becomes large, so that such a problem arises that currents caused to flow in the write word line and the bit line become large. On the other hand, an MRAM (Spin-RAM) utilizing a spin transfer torque technique for causing current to flow in the tunneling magnetoresistance TMR perpendicularly thereto to change a direction of spin in the free layer, which is introduced in "2005 International Electron Device Meeting Technical Digest Papers pp. 473-476" (Non-Patent Document 1), has been reported. As shown in FIG. 31, in the rewrite system, the direction of spin in the free layer can be controlled by current flowing perpendicularly to the fixed layer, the tunnel layer, and the free layer. Therefore, since current required for rewrite operation is proportional to the size of the tunneling magnetoresistance TMR, miniaturization can be achieved and rewrite current can be reduced. Thus, the rewrite system is excellent in scalability.

SUMMARY OF THE INVENTION

Even in a spin-injection MRAM, however, a current density (threshold current) required for rewrite is $1 \times 10^6$ to $10^7$ A/cm$^2$, and when the current density is applied to a device of 50 nm×100 nm, current of 50 µA is required, which is a equal current level to that of which can drive a MOS transistor with a minimum feature size.

On the other hand, during examination, the present inventors have found that the current density (threshold current) required for rewrite is a function of write time (write pulse width) and larger current is required in order to reverse the direction of spin sufficiently in a shorter write time. More specifically, though the spin-injection MRAM has excellent scalability and it is excellent in high-speed writing, since large current is caused to flow when writing is performed at high speed, a large MOS transistor is required. On the contrary, when a small MOS transistor is used in order to reduce an area, high-speed writing can not be performed.

Further, a spin-injection MRAM is excellent in scalability and it can be miniaturized. However, according to advance of miniaturization, manufacture variations among respective memory cells become large, so that variations in write current may occur among the respective memory cells. Therefore, it is necessary to reduce variations among currents caused to flow in memory cells at writing.

Still Further, in a spin-injection MRAM, a write operation and a read operation are different only in current to be caused to flow. Therefore, such a possibility occurs that erroneous write may be conducted at reading. In order to avoid such an error, it is necessary to reduce read disturb.

In order to solve the abovementioned problems, main inventions disclosed in this specification are as follows:

First, at a write operation in a spin-injection MRAM, after first current is caused to flow in a tunneling magnetoresistance, second current larger than the first current is caused to flow therein.

Second, a time period of causing current to flow in a memory cell at a read time of the spin-injection MRAM is shorter than a time period of causing current to flow at a rewrite time in the spin-injection MRAM, and current values at both the time periods are set to approximately the same.

Third, at a write operation time of the spin-injection MRAM, charge charged in a capacitor is caused to flow.

Fourth, at a write operation time in the spin-injection MRAM, a magnetic field is generated using a write-auxiliary line so that the magnetic field influences the tunneling magnetoresistance.

Fifth, before a write operation in the spin-injection MRAM, current is caused to flow to a bit line to generate a magnetic field so that the magnetic field influences the tunneling magnetoresistance.

High-speed write or stable operation can be realized.

BRIEF DESCRIPTIONS OF THE DRAWINGS

DESCRIPTIONS OF THE PREFERRED EMBODIMENTS

Figure 1:
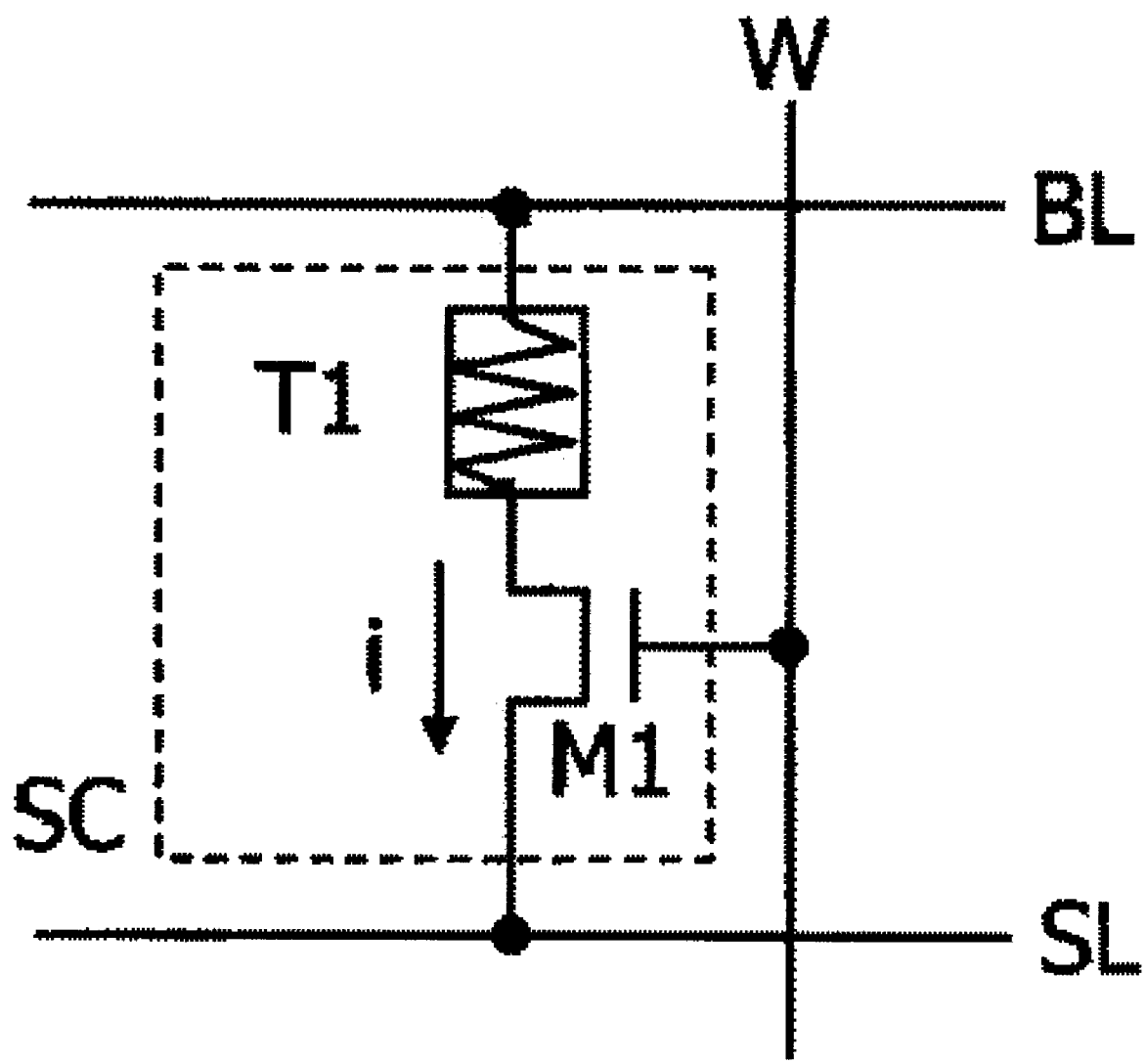
FIG. 1 is a diagram showing a first embodiment of the present invention.

A first embodiment of the present invention will be explained with reference to FIG. 1 and FIG. 2. A memory cell SC with a present configuration of the first embodiment is composed of an n-type MOS transistor M1 and a tunneling magnetoresistance T1, and M1 and T1 are connected to a bit line BL and a source line SL, as shown in FIG. 1, where the gate of M1 is controlled by a word line W. As the tunneling magnetoresistance T1 which is explained as TMR in FIG. 26, it includes at least two magnetic layers, one thereof being a fixed layer PL whose spin direction is fixed and the other being a free layer FL where the spin direction takes two states of a parallel state and an anti-parallel state to the fixed layer. Storage of information or data is performed according to the direction of spin in the free layer, where electric resistance of the tunneling magnetoresistance changes to a high resistance state in the anti-parallel state while it changes to a low resistance state in the parallel state. When the word line is selected, current flows from the BL side to the SL side in a direction "i" in FIG. 1 when the BL side is higher in potential than the SL side, and current flows in a direction opposite to the direction "i" when the SL side is higher in potential than the BL side. Accordingly, as explained in FIG. 27, the direction of spin can be controlled correspondingly, thereby writing information corresponding to the direction.

Figure 2A:
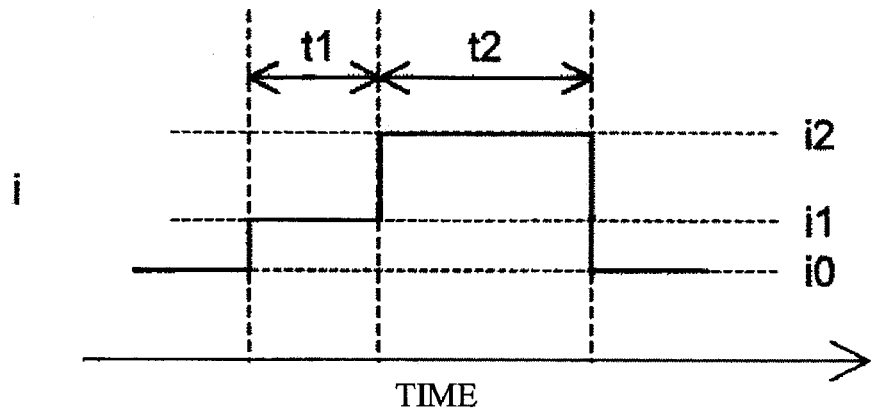
FIG. 2A is a diagram showing an operation example of the first embodiment of the present invention.
Figure 2B:
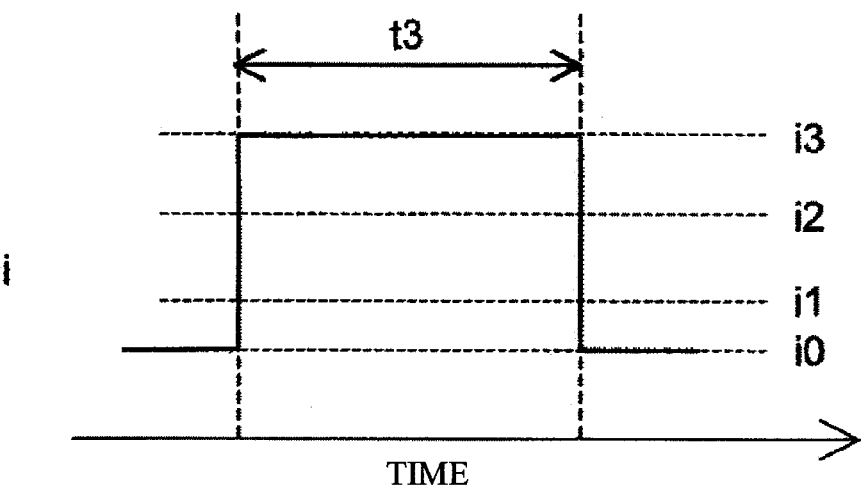
FIG. 2B is a diagram showing an operation example of the first embodiment of the present invention.
Figure 2C:
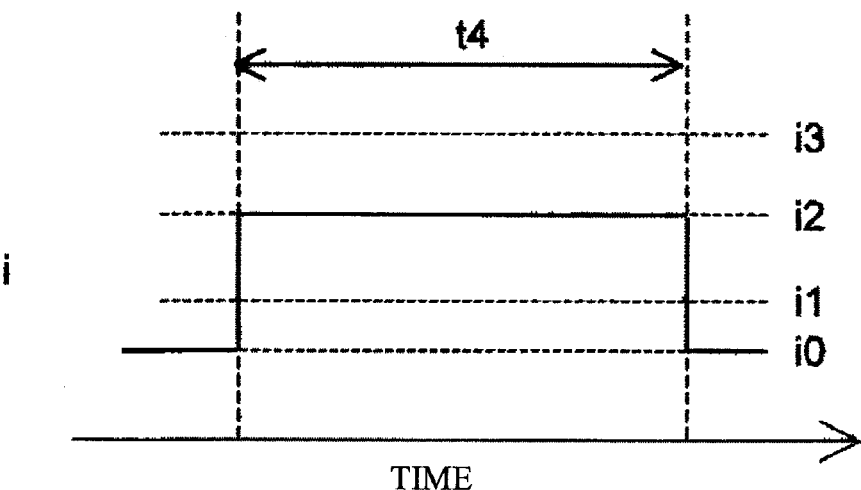
FIG. 2C is a diagram showing an operation example of the first embodiment of the present invention.
Figure 3:
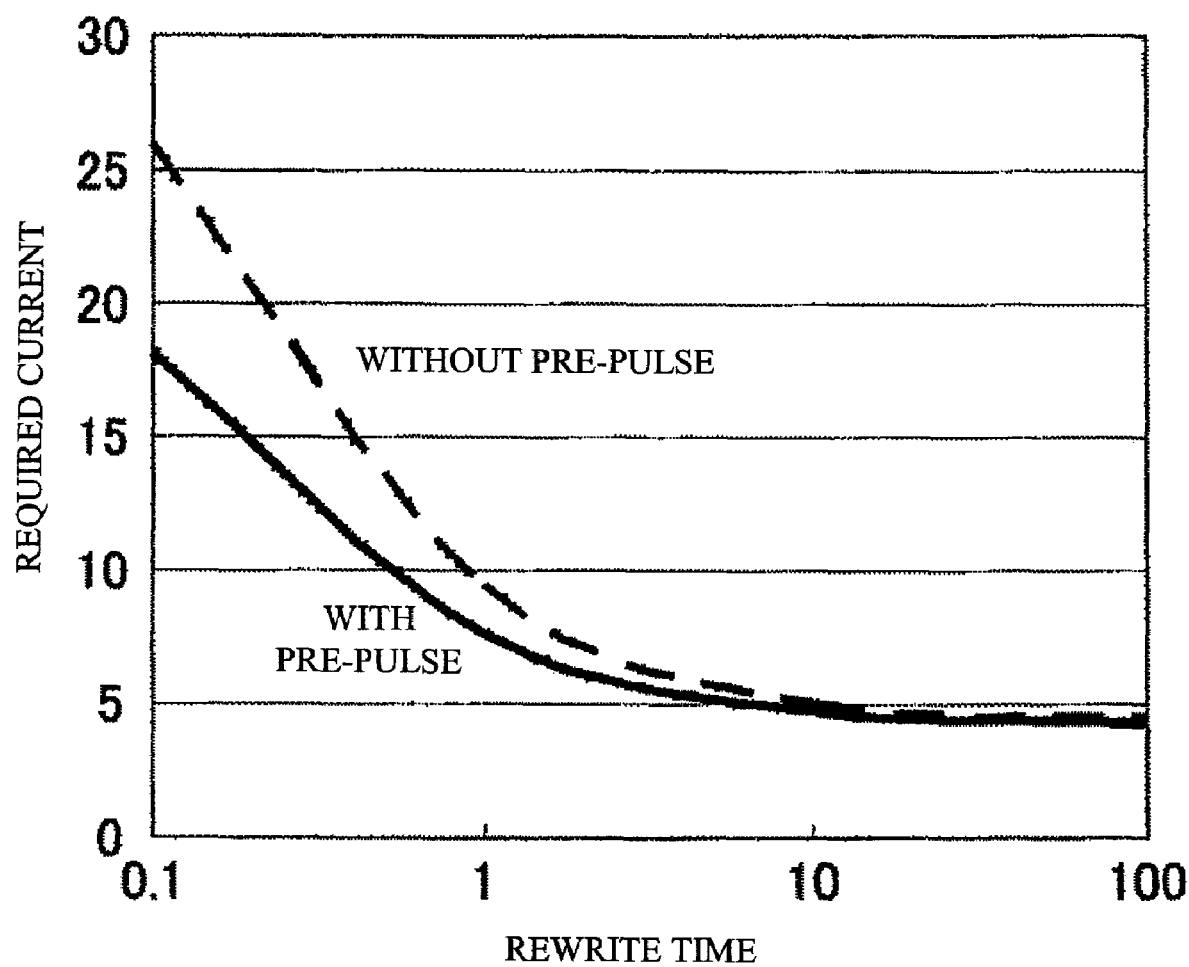
FIG. 3 is a graph showing an experiment result obtained when the first embodiment of the present invention is used.

A feature of the present configuration is shown in FIG. 2A. A value of the current "i" is shown along time on the horizontal axis. More specifically, a current value in non-selected state is i0 (for example, the value is 0 μA), a current value of the first time period T1 is i1, a current value of the next time period t2 is i2, with such a feature that i1 is smaller than i2. In the present specification, an operation for providing the first weak current i1 is called "pre-pulse." In comparison with the pre-pulse, as shown in FIG. 2B, in a case where the pre-pulse is not provided, when a constant current i3 is caused to flow in a rewrite operation time, the i3 takes a value larger than that of the i2. Further, as shown in FIG. 2C, even if current to be caused to flow is set to the same as the i2, a rewrite operation time t4 becomes longer than the time t2. As the reason that such a phenomenon occurs, it is thought that spin in the free layer is swung and a direction thereof is put in an easily changeable state. Accordingly, the spin is put in an easily changeable state by causing the first weak current to flow instead of causing rewrite current to flow at one time, and the original rewrite current is then caused to flow, so that smaller rewrite current can be realized. FIG. 3 shows an illustrative diagram of an experimental result obtained when the present invention is used. A rewrite time is on the horizontal axis and current required for rewrite is on the vertical axis. Since respective values are standardized at desired points, the unit is arbitrary. As shown in FIG. 3, rewrite can be performed in a shorter time by first providing the weak current as shown in FIG. 2A (with pre-pulse).

As described above, by first providing the weak current i1 and then providing the current i2 larger than the current i1 (FIG. 2A), rewrite can be performed with lower current value and a high-speed rewrite operation can be realized. Note that, unless current for an original rewrite operation is caused to flow after the pre-pulse operation, a state of the memory cell returns back to its first state, and it does not take another state. A pre-pulse may be provided to only a memory cell to be rewritten and it may be provided to memory cells including memory cells in which rewriting is not performed at the same time.

Figure 4:
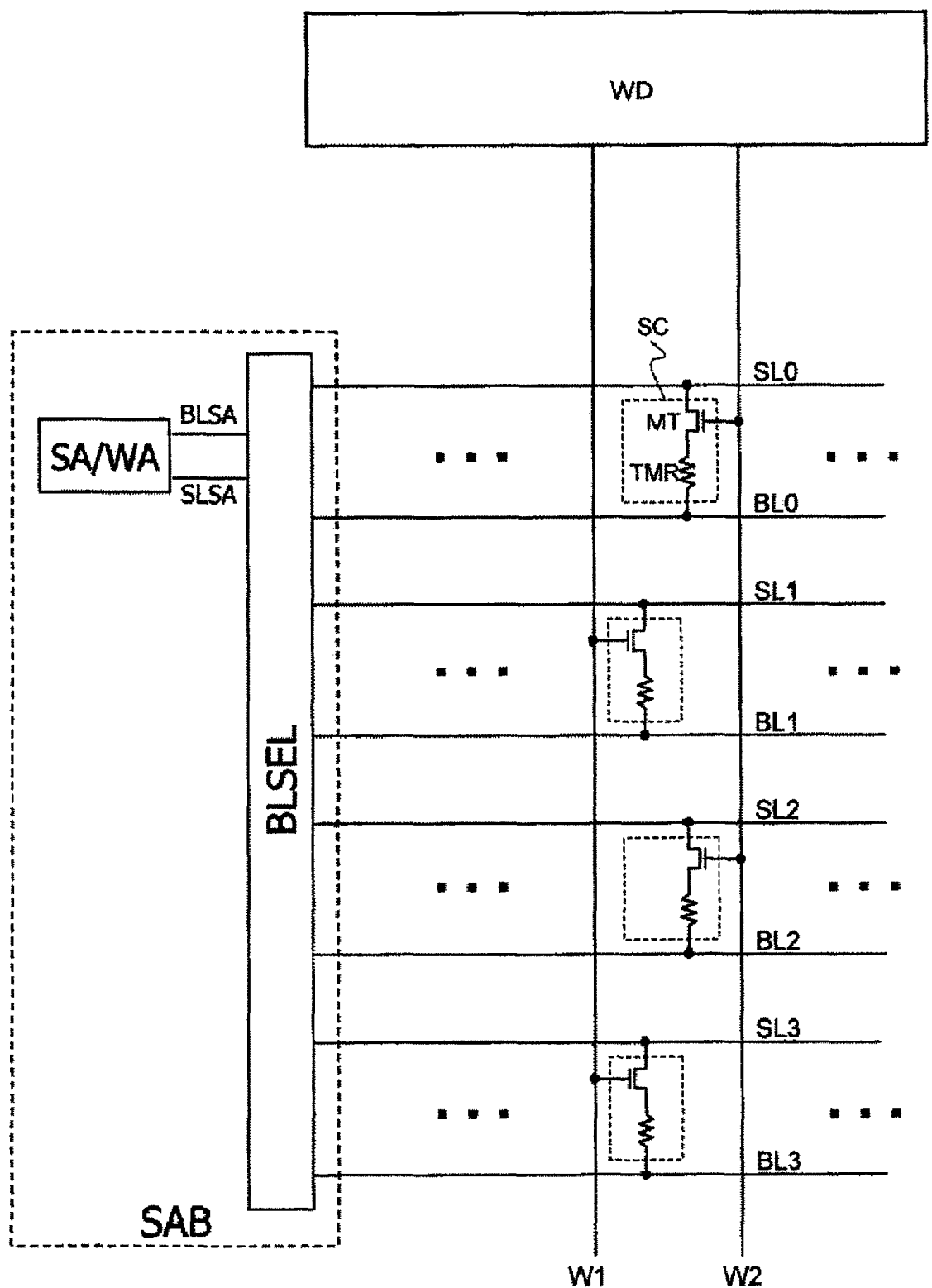
FIG. 4 is a diagram showing a configuration example of a memory array when the first embodiment is realized.

FIG. 4 shows a memory array applied with the present invention. The memory cell SC is controlled by a word driver WD, word lines are denoted by W1 and W2, each of the memory cells is composed of the MT and the tunneling magnetoresistance TMR, and the MT and the TMR are connected to the bit line BL and the source line SL as shown in FIG. 4.

In FIG. 4, memory cells SC are arranged at crossing points of half numbers of word lines and bit lines, but they may be arranged at all crossing points of the word lines and the bit lines. A bit line/source line selecting circuit BLSEL, a sense amplifier SA for amplifying fine current in a bit line, and a write circuit WA for writing data in a memory cell are arranged in a sense amplifier block SAB. In FIG. 4, an example where four pairs of bit line/source line pairs are connected to one sense amplifier/write circuit, but the present invention is not limited to this configuration. One sense amplifier/write circuit is connected with one pair of bit line/source line pair. In this case, dimensions become large, but since the sense amplifier is connected to all the bit lines, the configuration is advantageous for outputting a large volume of data to the outside at one time. On the other hand, when one sense amplifier/write circuit is disposed to a plurality of bit line/source line pairs such as four pairs, eight pairs or sixteen pairs, the number of sense amplifier/write circuits can be reduced, thereby obtaining such an advantage that dimensions can be reduced.

Figure 5:
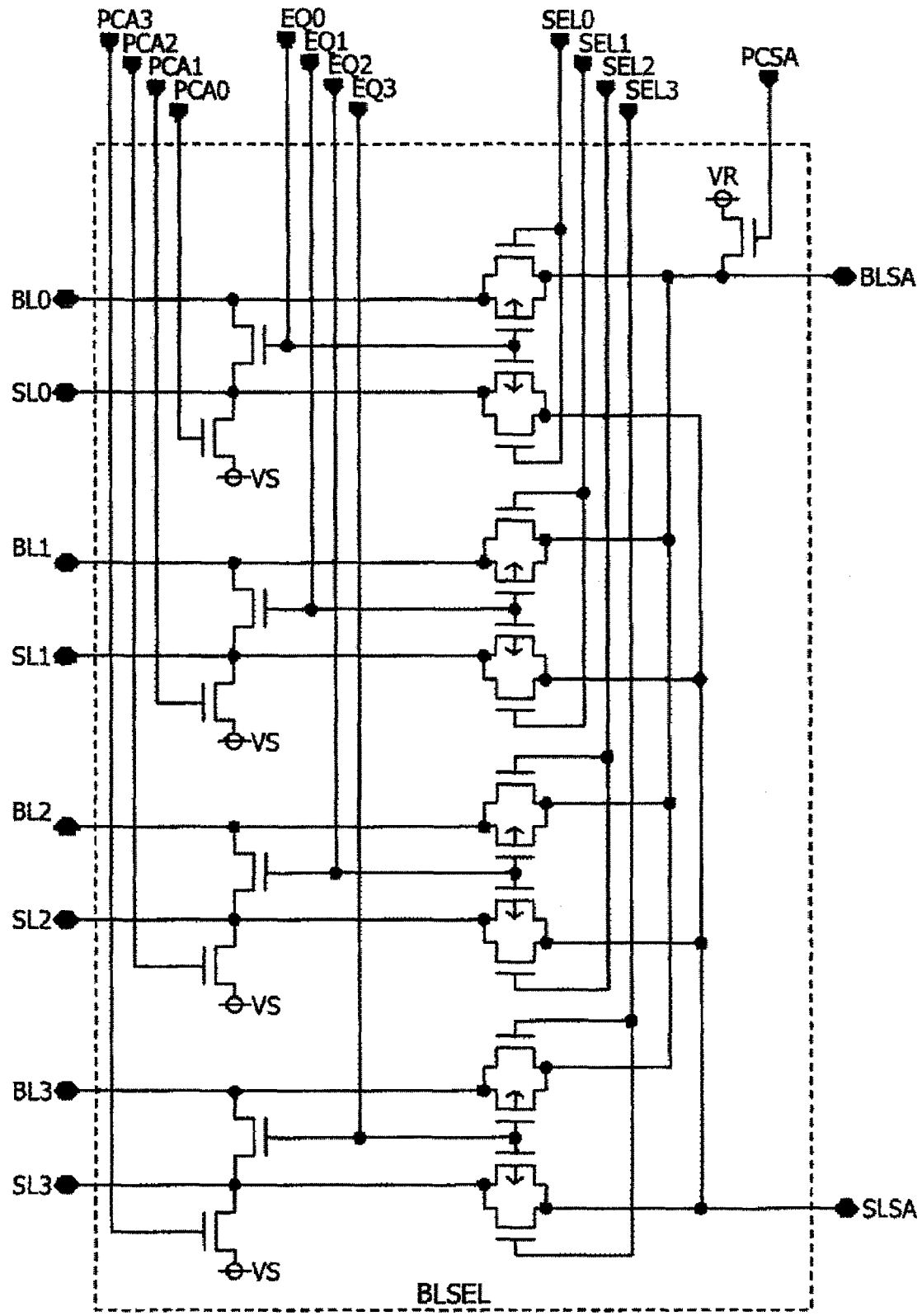
FIG. 5 is a diagram showing a configuration example of a bit line and source line select circuit shown in FIG. 4.

FIG. 5 is a diagram showing a bit line/source line selecting circuit for selecting one pair of bit line/source line pair from four pairs of bit line/source line pairs according to a bit line selection signal SEL0, SEL1, SEL2, SEL3. This circuit also includes an equalize MOS for setting to a predetermined voltage Vs in a non-selected state of a bit line and a source line according to an equalize signal EQ0, EQ1, EQ2, EQ3 and a precharge signal PCA0, PCA1, PCA2, PCA3, and a precharge circuit for setting to a predetermined read voltage (VR) in read state according to a sense amplifier precharge signal PCSA. This circuit is not limited to the circuit shown in FIG. 7. Another circuit configuration can be adopted if it has a similar function.

Figure 6:
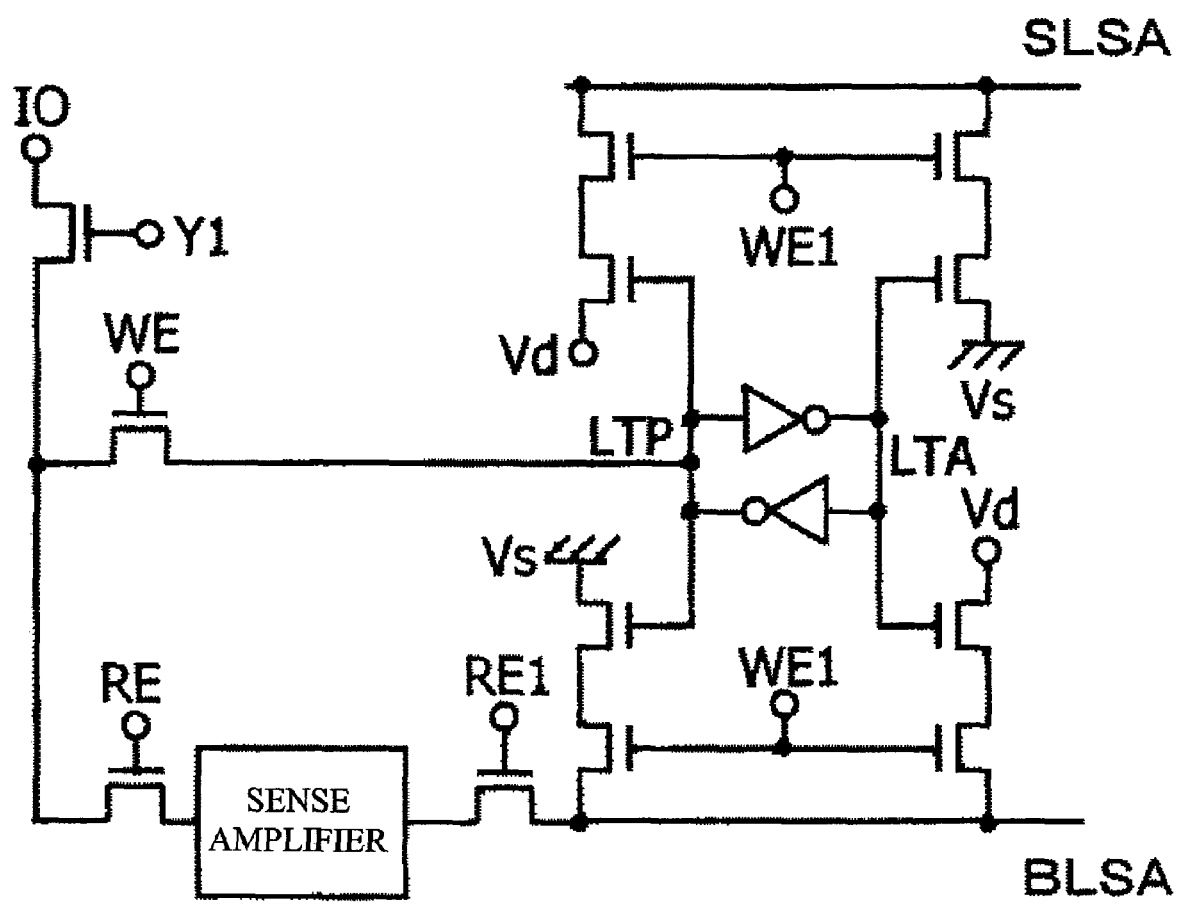
FIG. 6 is a diagram showing a configuration example of a sense amplifier and a write circuit shown in FIG. 4.

FIG. 6 shows a configuration example of a sense amplifier SA and a write circuit WA shown in FIG. 4. In FIG. 6, reduction of area can be achieved by adopting this configuration. The write circuit first includes a latch circuit composed of two stages of inverter circuit having outputs of LTP and LTA. The latch information is set by a column selecting signal Y1 and a first write control signal WE according to information from an input/output line IO. According to values of the LTP and LTA of the result and a second write control signal WE1, when MOS transistors connected to thereto are turned ON, a bit line BLSA and a source line SLSA are electrically connected to Vd or Vs. The bit line BL and the source line SL selected by the bit line/source line selecting circuit BLSEL are also electrically connected to Vd or Vs. Note that, since a pair of the bit line BLSA and the source line SLSA, and a pair of the bit line BL and the source line SL are controlled similarly, the bit lines BLSA and BL are handled as the same line and the source lines SLSA and SL are handled as the same line unless otherwise noted, in order to prevent the following explanation from being complicated. At this time, when the bit line BL is electrically connected to Vd, meanwhile it means that the LTP is at a high potential and the LTA is at a low potential, the source line SL is electrically connected to Vs. A potential of the latch circuit is set to be higher than Vd in order to reliably supply Vd to the bit line and the source line. In a read time, by the read control circuits RE1 and RE, a signal on the bit line BL can be taken in the sense amplifier to be amplified or a signal of the sense amplifier can be outputted to the IO via the MOS transistor controlled by the column selecting signal Y1. By using the circuit configuration shown in FIG. 6, the operation of the present invention explained in FIG. 1 to FIG. 3 can be performed.

Figure 7:
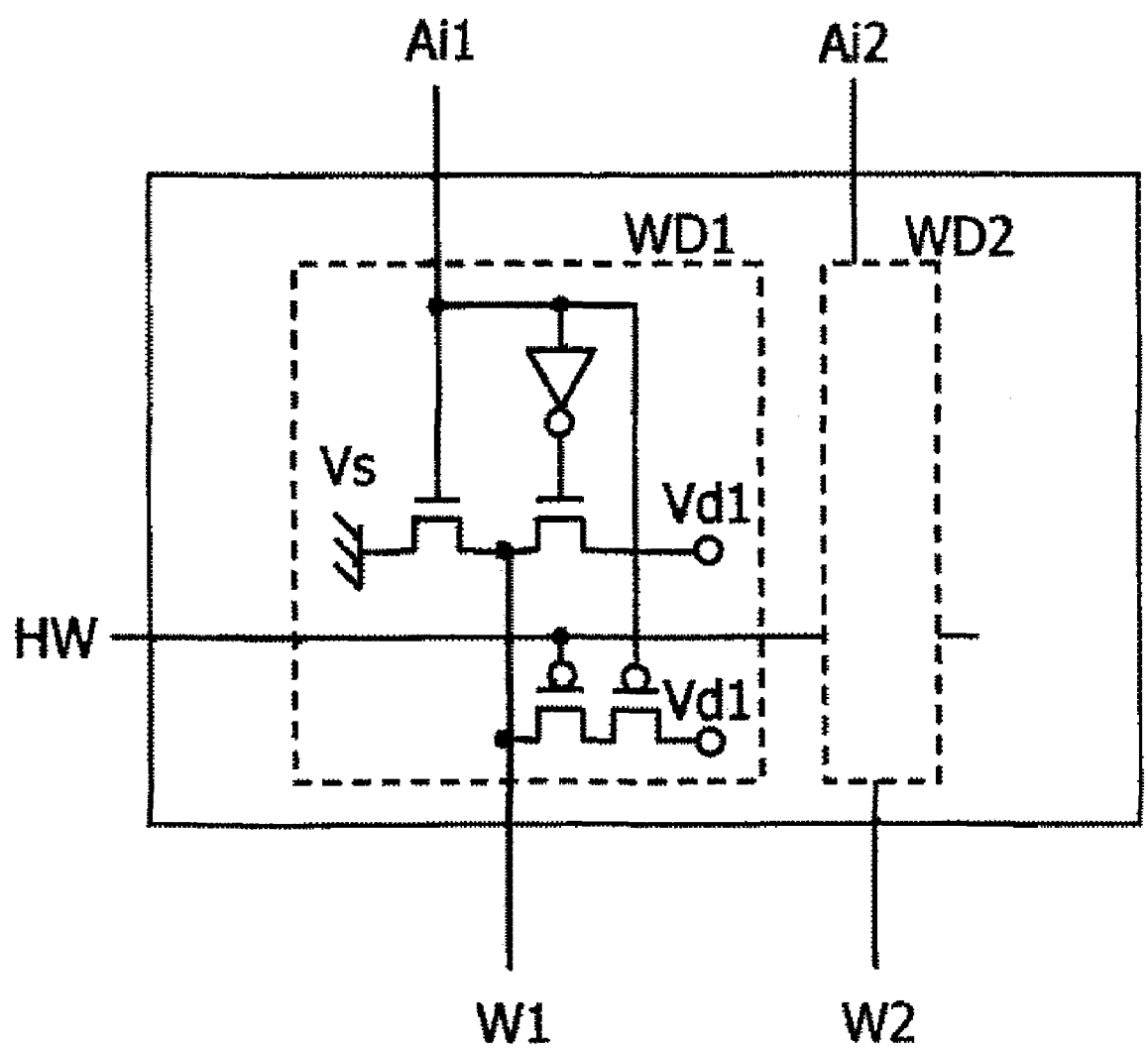
FIG. 7 is a diagram showing a configuration example of a word driver in FIG. 4.

FIG. 7 is a diagram showing a circuit example of the word driver WD shown in FIG. 4. The word driver WD in FIG. 7 shows a configuration for realizing pre-pulsing by controlling the word line. The word driver is a circuit for selecting the word line W1 or W2 according to a signal (decode signal) selected by external addresses which are here shown as two examples of Ai1 and Ai2. At this time, the word line can be applied with a voltage lower than Vd1 by a threshold value of an nMOS, and a voltage which is higher than the former voltage and is equal to Vd1 through switching of HW. That is, since Ai1 and Ai2, and HW are at high level in non-selected state, the word line is at Vs level. Here, when Ai1 is selected to be changed to low level, a gate of the nMOS inserted between Vd1 and W1 is changed to Vd1 by the output of the inverter receiving the low level. Therefore, a voltage lower than Vd1 by the threshold value of the nMOS is outputted to the word line. Next, when HW is also changed to low level, gates of two pMOSs connected in series and inserted between Vd1 and W1 are changed to low level, so that a voltage equal to Vd1 is outputted to the word line. According to this example, it is possible to generate two kinds of voltages, thereby realizing an operation for causing currents having two kinds of current values to flow, which is required for the present invention.

Figure 8:
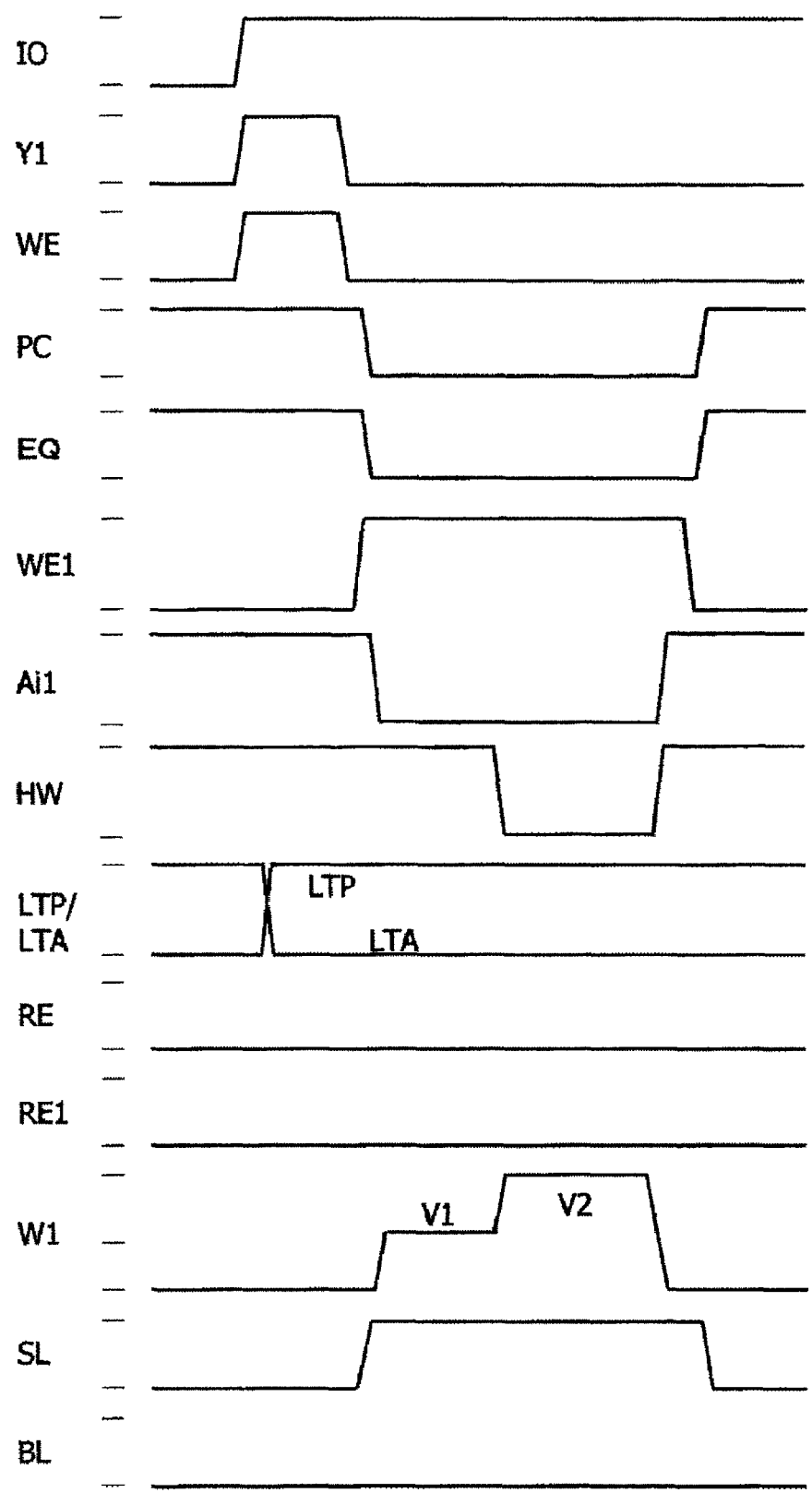
FIG. 8 is a diagram showing operation waveforms of circuits shown in FIG. 4 to FIG. 7.

FIG. 8 is a diagram showing an operation example of circuits shown in FIG. 4 to FIG. 7. The operation is an operation for fetching rewrite data from IO to perform rewrite using the method of the present invention. It is assumed that IO is initially in low potential and it is changed to high potential as rewrite data. The rewrite data is fetched to the latch by changing Y1 and WE to high potential. As a result, LTP is switched from low potential to high potential, and LTA is switched from high potential to low potential. Since the pre-charge signal PC and the equalize signal EQ are at high potential at this time, both the bit line BL and the source line SL are at low potential Vs. And the source line SL and the bit line BL are capable of being electrically connected to the high potential Vd and the low potential Vs, respectively, when WE1 is switched. Thereafter, PC and EQ are changed to low potential, and the bit line BL and the source line SL are electrically disconnected from the low potential Vs. Thereafter, WE1 is changed to high potential, so that the source line SL and the bit line EL are electrically connected to the high potential Vd and the low potential Vs, respectively. At this time, the decode signal Ai1 is switched, so that the word driver WD1 is operated and the word line W1 is first changed to a potential of V1 (pre-pulse operation). As shown in the circuit diagram in FIG. 7, the V1 takes a value of a voltage lower than Vd1 by the threshold value of the nMOS. Therefore, small current corresponding to FIG. 2 flows in the memory cell. Accordingly, the spin in the memory cell becomes easily changeable of its direction. Thereafter, the signal line HW is switched. Accordingly, as shown in the circuit diagram in FIG. 7, a voltage is applied with the voltage Vd1 to the word line via the PMOS, so that the voltage of the word line W1 becomes V2 (=Vd1), which is yet higher. Larger rewrite current i2 corresponding to FIG. 2 flows in the memory cell. Thereby, the spin in the memory cell is oriented to a desired direction, thereby performing rewrite operation. At this time, according to an operation for applying V1 to the word line and then applying V2 thereto at one time, V2 can be lower or a duration of application of V2 can be shorter than the case where a voltage for rewrite operation is applied to the word line at one time (more specifically, high-speed rewrite can be performed). The present invention is capable of reducing rewrite current or achieving speeding-up of rewrite in this manner. When the rewriting is terminated, the word line is returned back to the original low potential, WE1 is changed to low potential, and PC is changed to high potential. Thereby, both the bit line BL and the source line SL are changed to the low potential Vs.

Figure 9:
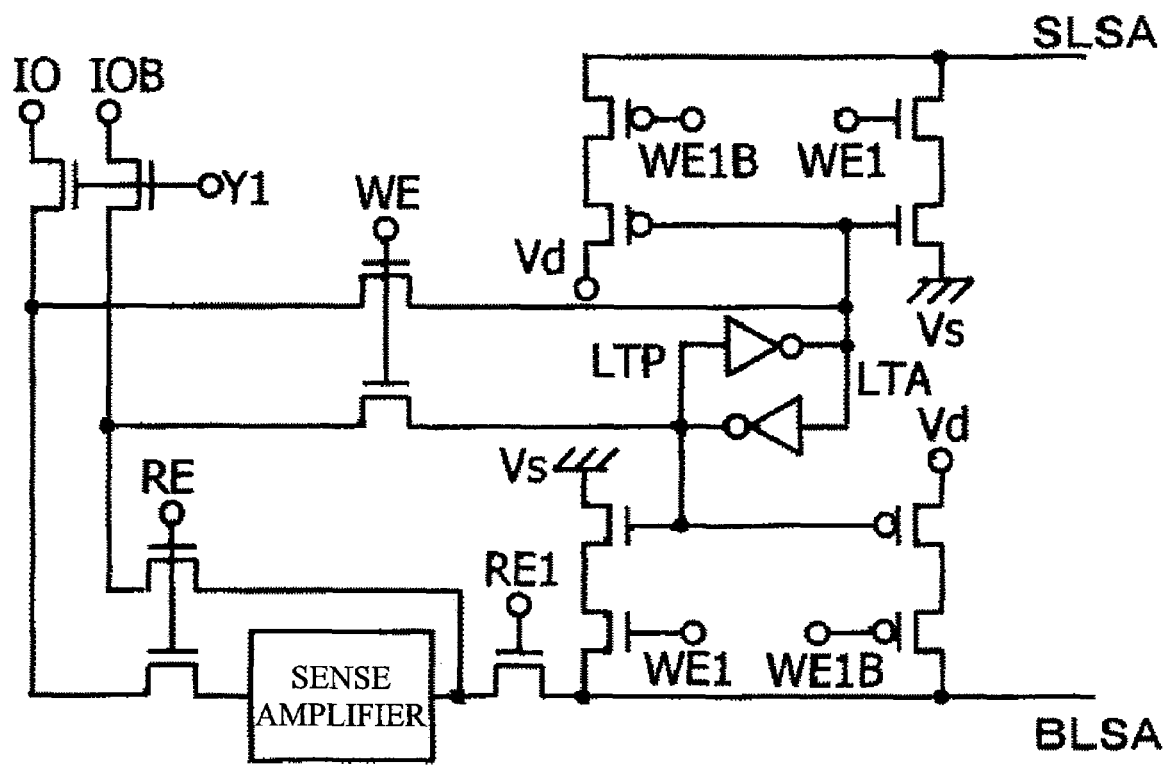
FIG. 9 is a diagram showing another configuration example of the sense amplifier and the write circuit shown in FIG. 6.

FIG. 9 is a diagram of another configuration example of the write circuit to realize the present invention. A difference between FIG. 9 and FIG. 6 lies in that the input/output line is composed of differential signal lines (complementary signal lines) and that the MOS transistor connecting Vd and the bit line BL or the source line SL is composed of a p-type MOS transistor. First, high-speed and stable read can be achieved by adopting the differential signal line. Further, by adopting the p-type MOS transistor, even if the power supply voltage of the latch is Vd, the potential of Vd can be applied to the bit line BL or the source line SL.

Specifically, in order to constitute the input/output line IO by a differential signal line, the input/output line must include two lines of IO and IOB, where signals indicating a differentiation appear at these signal lines. Therefore, the first write control signal WE and the read control signal RE control two MOS transistors. Outputs of both ends of the sense amplifier are connected to IO and IOB of the input/output lines via the MOS transistors controlled by RE. Further, due to constituting the MOS transistors connecting Vd and the bit line BL or the source line SL by p-type MOS transistors, as described above, LTP and LTA which are outputs of the latch are inputted to the gate of the p-type transistor connecting Vd and the bit line BL or the source line SL. Still further, the second write control signal is constituted of WE1 and WE1B having an opposite phase to that of WE1, and the other p-type transistors for connecting Vd and the bit line BL or the source line SL is controlled by WE1B. The operation of the circuit shown in FIG. 9 is different from that of the circuit in FIG. 5 only in that the input/output for the differentiation is composed of IO and IOB, WE1B outputting a signal of an opposite signal to that of WE1 is prepared in addition to WE1, and the high potential of the output of the latch may be the potential of Vd. In the present embodiment, both the input/output line IO composed of the differential signal lines and the MOS transistors connecting Vd and the bit line BL or the source line SL are replaced by the p-type MOS transistors has been explained, but it is needless to say that only one of them may be selected and used arbitrarily.

Figure 10:
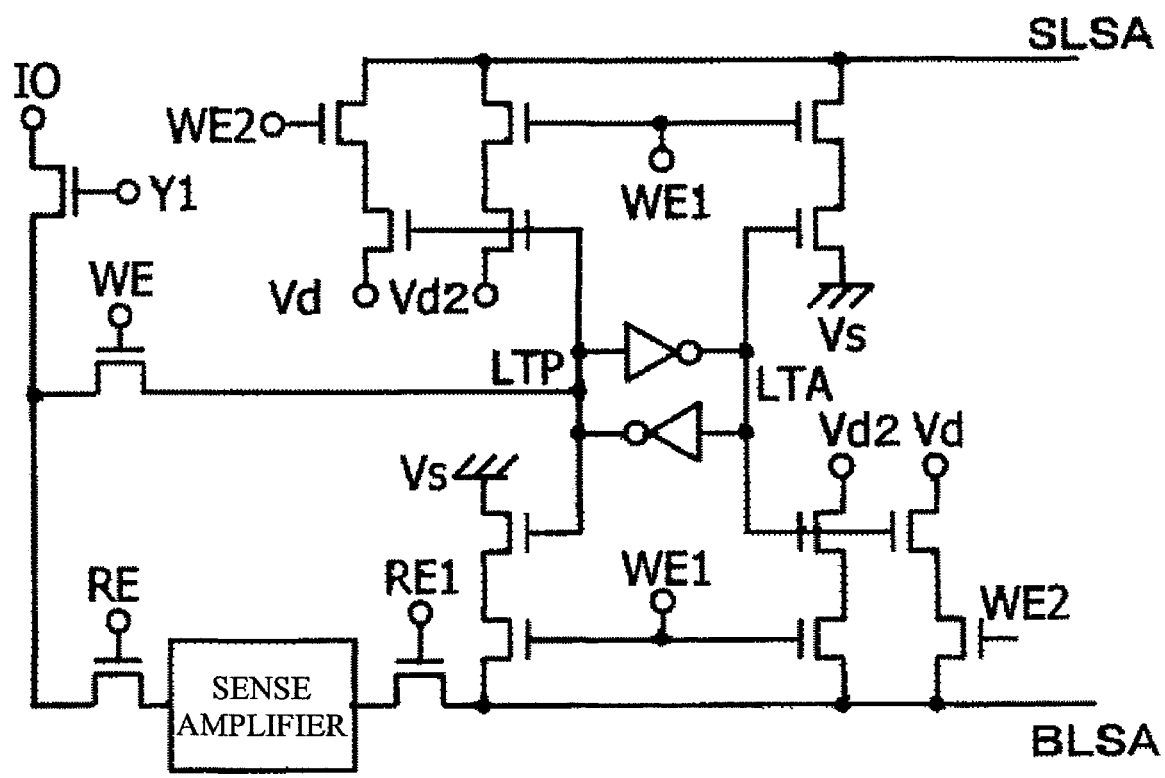
FIG. 10 is a diagram showing still another configuration example of the sense amplifier and the write circuit shown in FIG. 6.

FIG. 10 is a diagram showing another configuration example of the write circuit to realize the present invention. A feature of this circuit lies in that an operation of pre-pulse is operated by utilizing the voltage of a bit line BL and a source line SL instead of using the voltage of a word line. Thereby, it is unnecessary to adopt a constitution having two high potentials on the word line, which has been explained in FIG. 8, and the word line may have only one high potential, as described later. Accordingly, an ordinary word driver WD may be used as the word driver WD for this embodiment instead of the circuit as shown in FIG. 7. In order to realize the pre-pulse operation by driving the bit line/source line, two kinds of high potentials of Vd and Vd2 can be applied to the bit line BL or the source line SL in the circuit shown in FIG. 10. At this time, Vd2 is a potential lower than Vd. The Vd2 is used at a time of the pre-pulse operation, and Vd is used at the rewrite operation subsequent thereto. Therefore, as shown in FIG. 10, Vd2 and the bit line BL or the source line SL are electrically connected by a signal from WE1 according to an output of the latch, while Vd and the bit line BL or the source line SL are electrically connected by a signal from WE2 according to an output of the latch.

Figure 11:
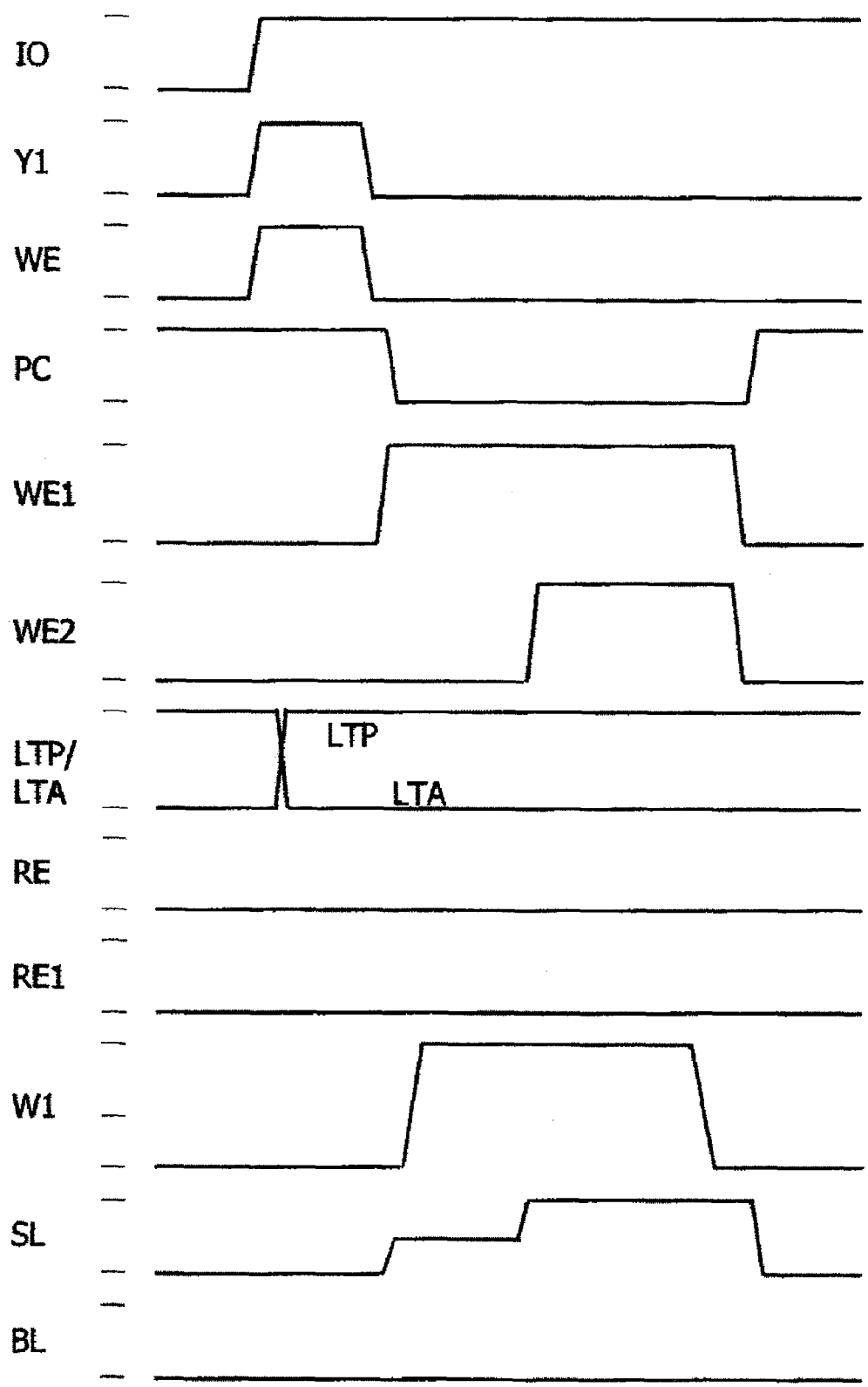
FIG. 11 is a diagram showing operation waveforms of a circuit shown in FIG. 10.
Figure 31A:
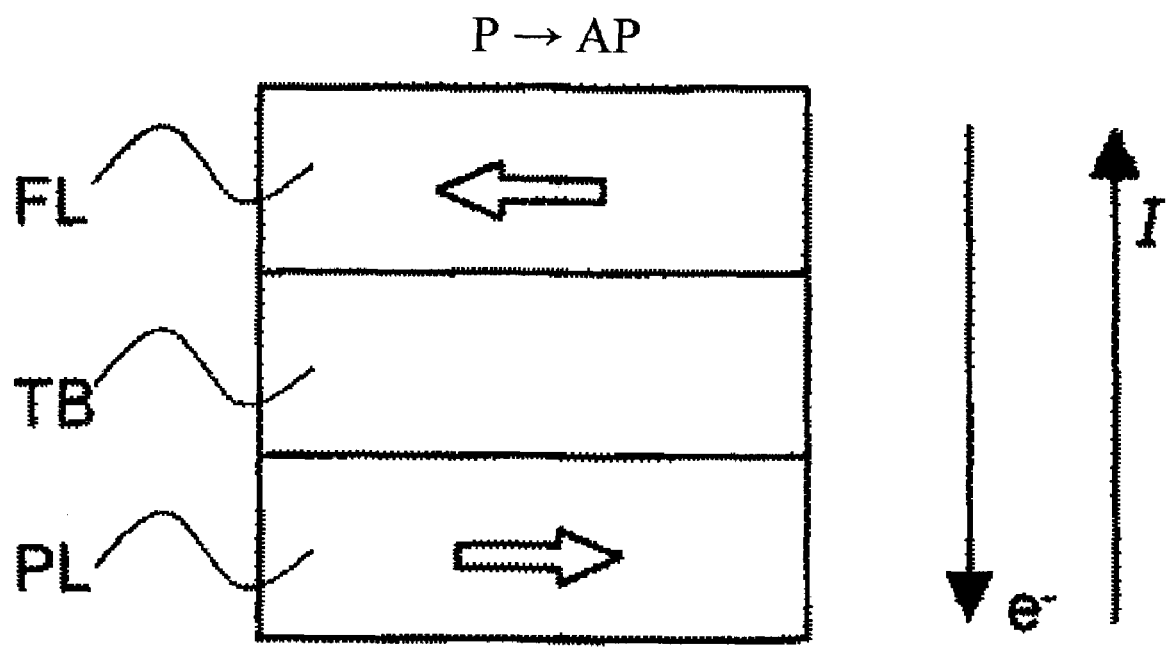
FIG. 31A is an explanatory diagram showing direction control of spin in a free layer.
Figure 31B:
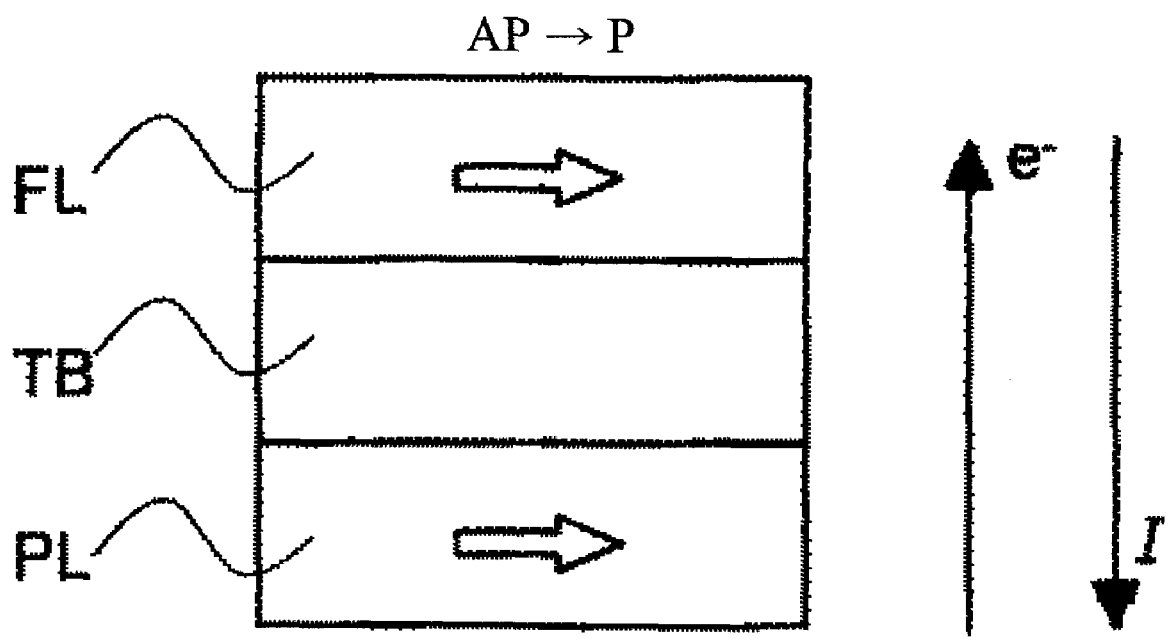
FIG. 31B is an explanatory diagram showing direction control of spin in the free layer.

FIG. 11 is a diagram showing an operation example of the circuit shown in FIG. 10. A difference between an operation in the circuit shown in FIG. 10 and that in the circuit shown in FIG. 6 is that a first high potential appears at the source line SL by a signal of WE1 and a second high potential then appears by a signal of WE2 in this example. The direction of spin is made easily changeable, in other word, easily reversible, by current flowing due to the high potential. Note that, in this example, the case where such a potential appears at the source line SL is explained, but a case where the potential appears at the bit line BL may be adopted. As explained in FIG. 31, this is because two directions are present for rewrite according to information to be written. An operation of this circuit proceeds in the following manner. By causing the circuit to operate in this manner, such a state that the direction of spin is made easily changeable can be created so that reduction of rewrite current or reduction of rewrite time can be realized, which results in low power consumption and high-speed.

Figure 12:
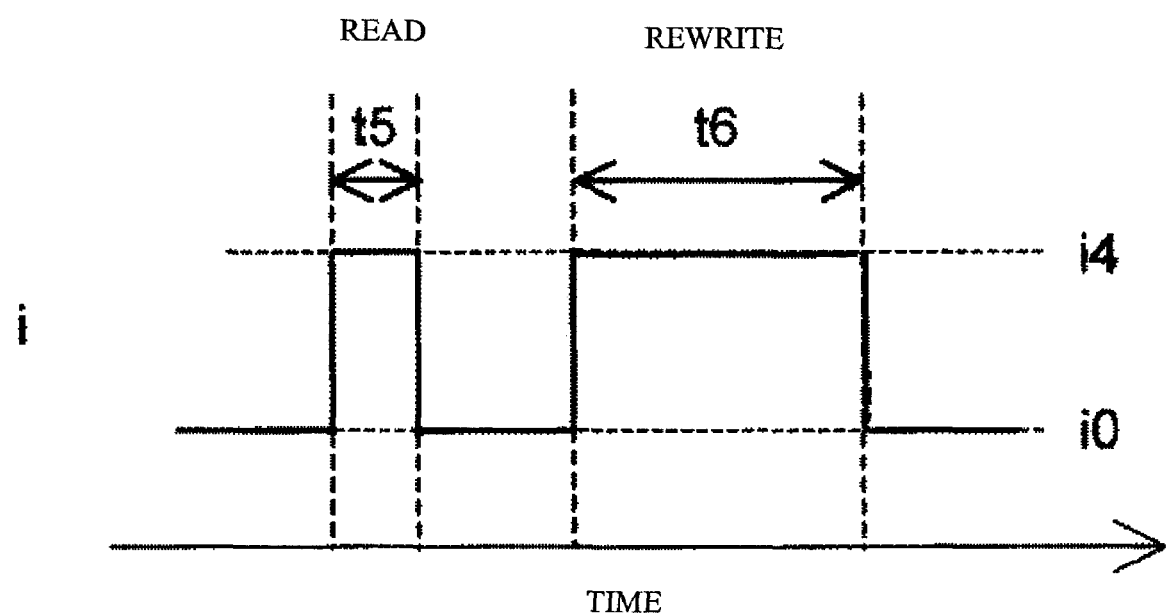
FIG. 12 is a diagram showing a second embodiment of the present invention.

A second embodiment of the present invention will be explained with reference to FIG. 12. Currents flowing in a memory cell at times of read operation and write operation and pulse widths of the currents are observed. A feature of the present invention lies in that current amounts for read and write are approximately equal to each other and the pulse width at the read operation time is smaller than the pulse width at the write operation time. More specifically, the current value is i4 and the same in both the times, but when the pulse width t5 at the read time is compared with the pulse width t6 at the write time, t5 is smaller than t6. When the feature is compared with flash memory, write current is smaller than read current for each memory cell and a required pulse width at the write time is larger than that at the read time, for example, in NAND flash memory. In MRAM which causes a wire to generate magnetic field utilizing current to perform rewrite, current at the write time is large. The reading and the writing having such feature as shown in FIG. 12 are performed in the present invention, which is different from the above-described example. Thereby, the present inventors found that disturb at the read time can be largely reduced. It was found that, the principle of utilizing the short pulse width at the read time is quite different from that of reducing the application time of the pulse causing disturb to be ordinarily reduced. This will be explained with reference to FIG. 13.

Figure 13:
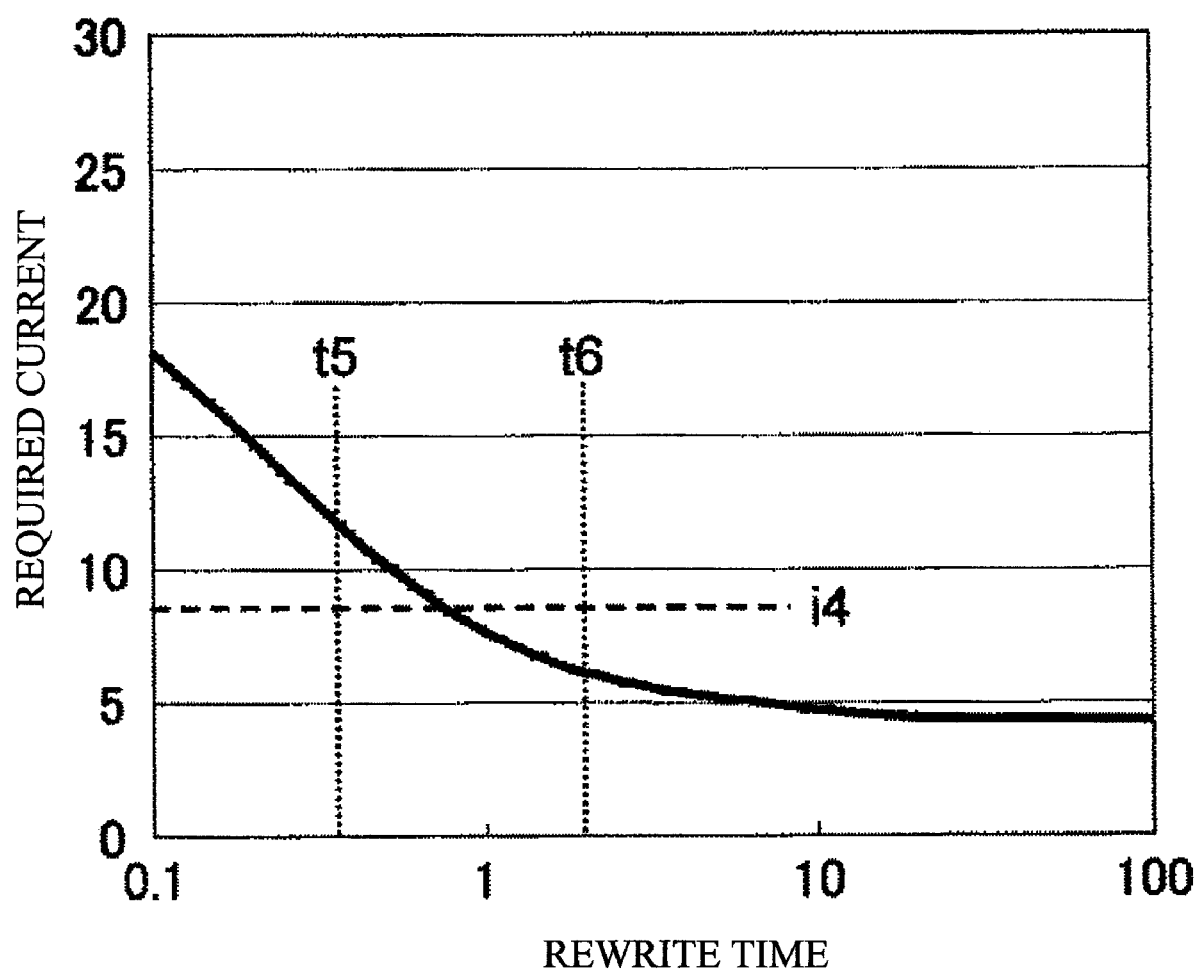
FIG. 13 is a graph showing an experiment result obtained when the second embodiment of the present invention is used.
Figure 30A:
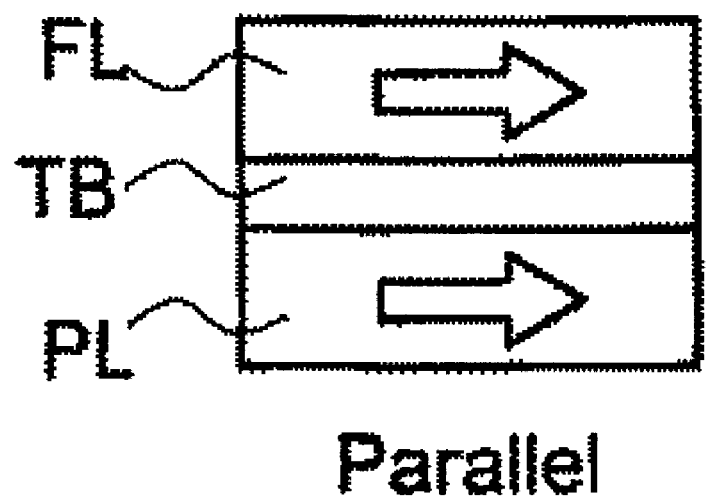
FIG. 30A is a diagram showing a structure example of a tunneling magnetoresistance TMR.
Figure 30B:
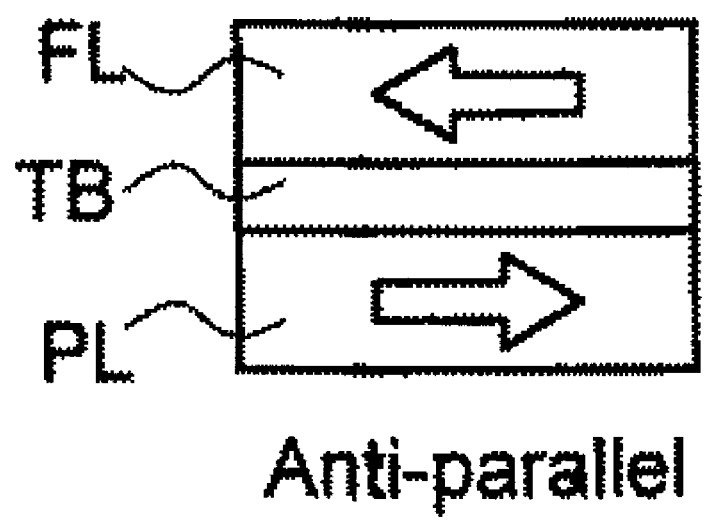
FIG. 30B is a diagram showing a structure example of the tunneling magnetoresistance TMR.

FIG. 13 is an illustrative diagram of an experimental result obtained when the second embodiment of the present invention is used. Rewrite time is on the horizontal axis and current required for rewrite is on the vertical axis. In FIG. 13, values are respectively standardized at desired points like the case shown in FIG. 3. Here, read disturb means a phenomenon that a weak rewrite operation happens in a read operation, so that data which has been written is changed. As shown in FIG. 13, current required for rewrite increases along with reduction of write time. Increase of current required for rewrite is disadvantageous in rewrite with low current, meanwhile, it means that the current capable of rewriting when rewrite time is long becomes incapable of writing when rewrite time is short. Consideration is made on a case setting the current value i4. In this case, when t6 is taken as the rewrite time, the current at this time is sufficiently larger than the current required for rewrite, so that the rewrite can be performed reliably. In general, rewrite is not performed with the minimum current required for rewrite. This is because the direction of some spins of many spins in the memory cell remains unchanged to the direction to rewrite. On the other hand, in this case, consideration is made about the rewrite time t5. At this time, the current value i4 is sufficiently smaller than the current required for rewrite. This means that, even if the current is caused to flow, rewrite is not performed. On the other hand, information of the memory cell can be read by the current in this region. More specifically, as explained in FIG. 30, electrical resistance of the tunneling magnetoresistance varies according to the direction of spin in the free layer, where the magnitude of the resistance can be read. At this time, write operation is hard to be performed with the current in this region, as described above. Therefore, even if reading is repeated, disturb is hard to occur. According to the present invention using this feature, read, write, and rewrite can be performed with the same current value i4 by only changing the pulse width of the current, as described again with reference to FIG. 12. Such a fact means that voltages applied to the memory cell at the rewrite time and at the read time may be the same, so that a simple circuit configuration can be adopted and a semiconductor storage device can be realized with low cost.

Figure 14:
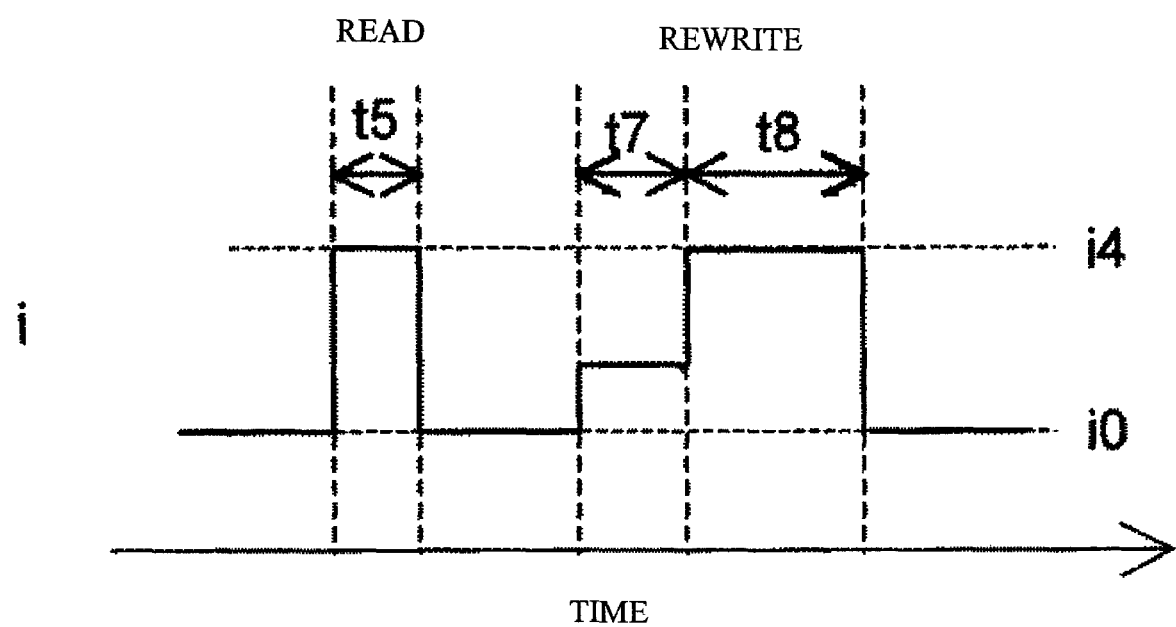
FIG. 14 is a diagram showing another configuration example of the second embodiment of the present invention.

FIG. 14 is a diagram showing another configuration example of the second embodiment of the present invention. The maximum currents at the read operation and at the write operation are approximately the same, but a pre-pulse operation is simultaneously used in the write operation. Therefore, i4 can be set to be smaller value and the rewrite time t7 can be reduced. Accordingly, the pulse width t5 for read and i4 which is a common current can be selected corresponding to the above operation, so that power consumption reduction and speeding-up can be achieved. Note that, FIG. 14 shows the current value, but the power consumption reduction and speeding-up can be realized by applying the same voltage to the bit line at the write time and at the read time.

Figure 15:
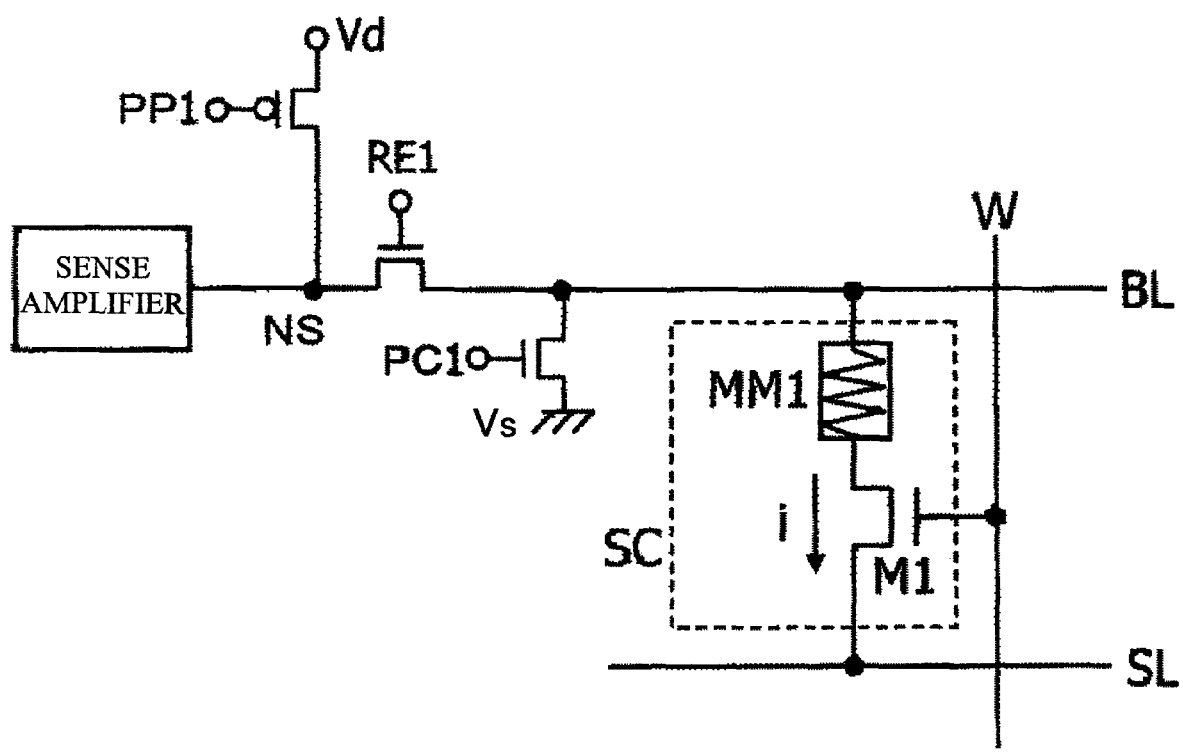
FIG. 15 is a diagram showing still another configuration example of the second embodiment of the present invention.

FIG. 15 is a diagram showing one example of a configuration for amplifying a signal at high speed in a short read time. The bit line BL is connected to the sense amplifier by a MOS transistor controlled by RE1, the bit line BL is connected to Vs by a MOS transistor controlled by PC1, and a connection node NS to the sense amplifier is connected to Vd by a MOS transistor controlled by PP1. A feature of this circuit lies in that the bit line BL is clamped at a voltage lower than the voltage of RE1 by a threshold voltage of the MOS transistor by NS which is kept at the voltage of Vd by a signal of PP1. Consequently, when the memory cell is turned ON, the potential of NS with a parasitic capacitance smaller than that of BL is changed at high speed. Therefore, the signal can be immediately amplified by the sense amplifier, and the memory cell may be turned OFF. In this manner, the ON time of the memory cell can be reduced. As described above, since current required for write becomes large according to reduction of current flowing time, disturb resistance is largely improved in the read operation. By using this configuration, signal voltage sufficient to perform amplification by the sense amplifier even in a short read time where disturb is hard to occur can be obtained. Incidentally, a similar configuration can be provided to the source line SL. As described above, by adopting the circuit configuration of the present embodiment, the MOS transistor controlled by RE1 is set to a so-called source follower mode, so that the voltage of the connection node NS is changed at high speed corresponding to the voltage change of the bit line BL. Therefore, a high-speed read operation is made possible.

Figure 16:
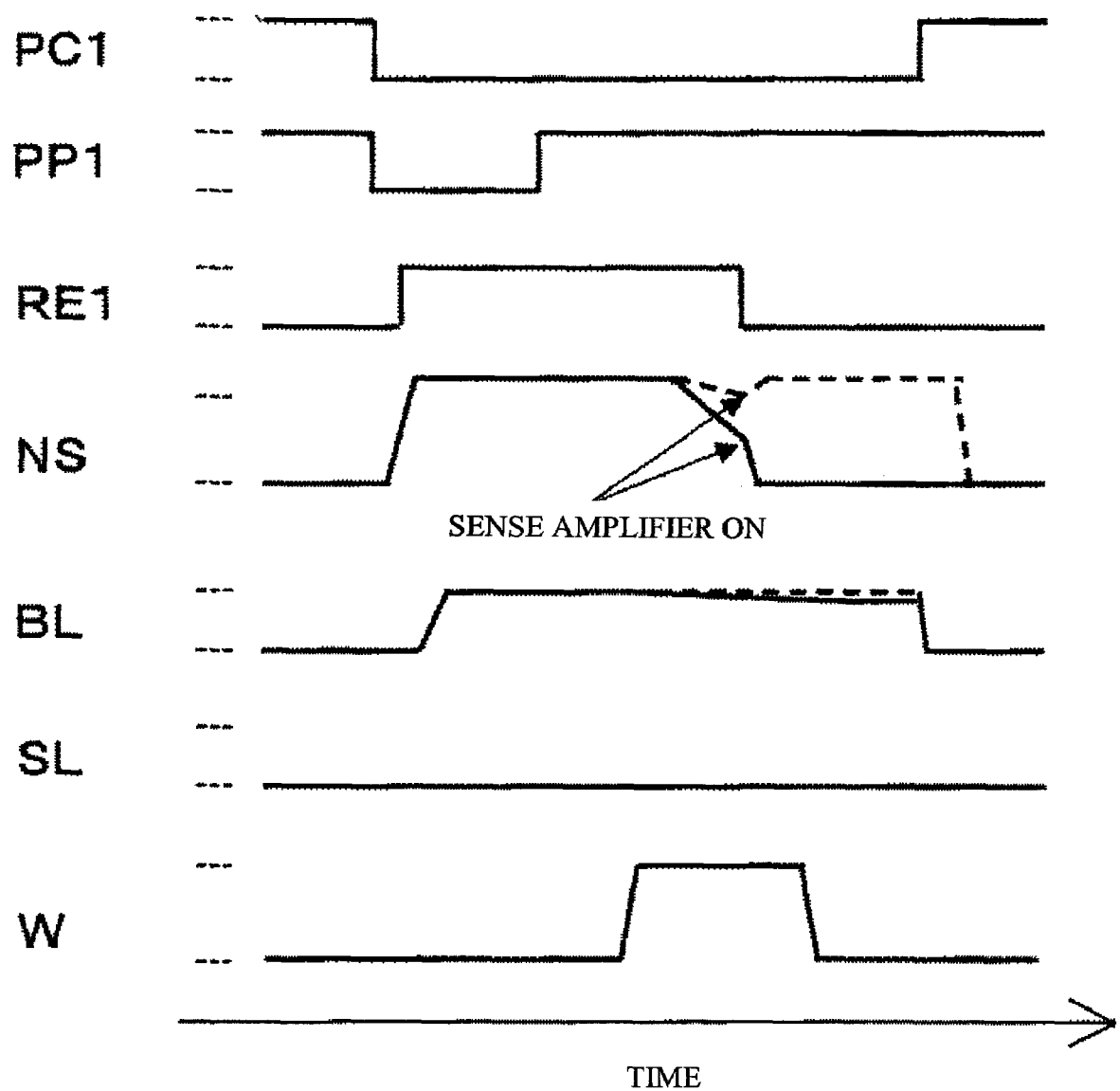
FIG. 16 is a diagram showing an operation example of the configuration example shown in FIG. 15.

FIG. 16 is a diagram showing an operation example of the circuit shown in FIG. 15. PC1 changes from high potential to low potential, PP1 then changes to low potential, and NS is electrically connected to Vd. In this state, when RE1 is changed to high potential, the bit line BL is precharged, by an n-type MOS transistor having RE1 connected to a gate thereof, to a voltage lower than the potential of RE1 by the threshold voltage of the n-type MOS transistor. Here, when the word line W is selected, current flows in the memory cell. However, the bit line BL is clamped at a voltage lower than the potential of RE1 by the threshold voltage of the n-type MOS transistor. As a result, since the parasitic capacitance of the bit line BL is remarkably smaller than that of NS, the potential of NS is changed largely. As a result, the sense amplifier can be turned ON, and before the turning ON, RE1 can be returned back to the low voltage and the word line can be closed. As a result, a time period where current is caused to flow in the memory cell can be shortened. This configuration can perform an operation at a speed higher than that in the case where the large parasitic capacitance of the bit line is directly discharged.

Figure 17:
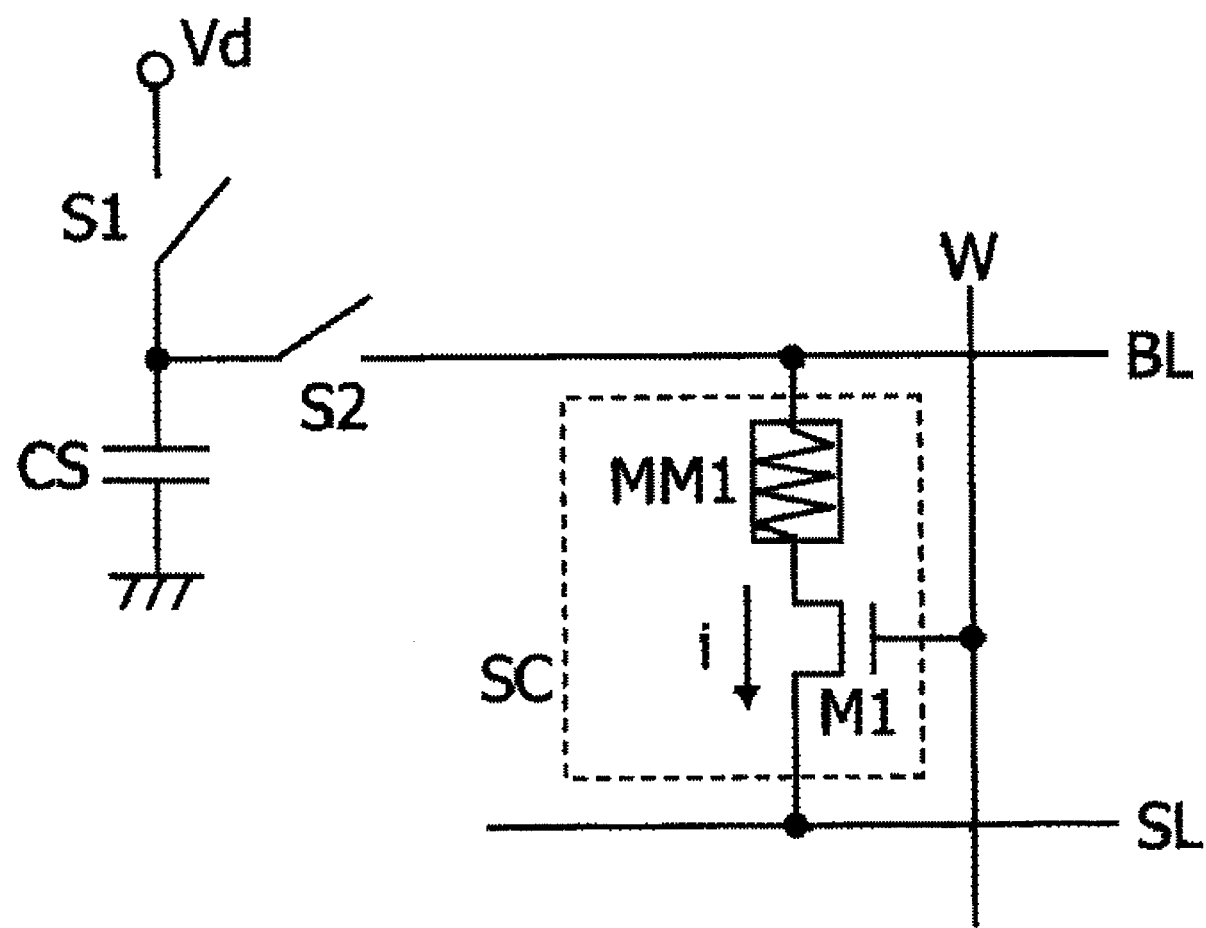
FIG. 17 is a diagram showing a third embodiment of the present invention.

FIG. 17 is a diagram showing a third embodiment of the present invention. In this embodiment, in order to apply a potential to the bit line BL, a capacitor CS, a switch S1 for connecting the capacitor CS to a power supply Vd, and a switch S2 for connecting the capacitor CS to the bit line BL are prepared. Conventionally, in order to supply a potential to the bit line BL, a configuration where the power supply Vd and the bit line BL are connected by a switch has been adopted. When the bit line is directly connected to the power supply like this manner, such a case may occur where flowing currents are different among respective memory cells due to performances of MOS transistors constituting the memory cells. In this embodiment, unlike the abovementioned case, the switch S1 is first closed so that the capacitor CS is charged by the power supply Vd. Thereafter, the switch S1 is opened and the switch S2 is closed so that current is supplied to the bit line BL with charge of the capacitor CS. By using this configuration, only constant charge accumulated on the capacitor CS is used, thus, fluctuation of the total amount of current flowing from the bit line to the memory cell and the amount of charge can be reduced. The state in the memory cell is changed due to the spin of charge flowing in the memory cell, but since the original charge amount is constant, the changed amount of spins in the respective memory cells are approximately the same. Accordingly, by adopting the present embodiment, a state after rewrite with small fluctuation can be produced. Note that, by forming a similar configuration to the source line SL to change the direction of rewrite current, required information can be rewritten. Note that, the capacitor CS can be formed using a MOS capacitor and a MIM capacitor.

Figure 18:
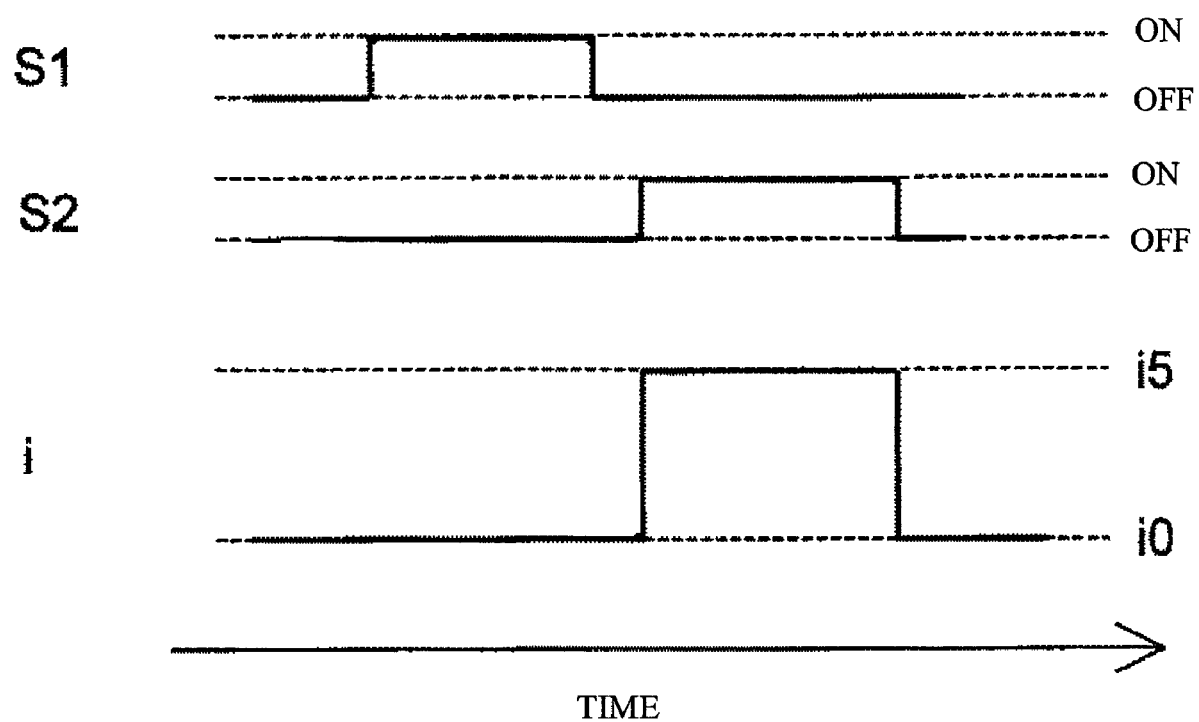
FIG. 18 is a diagram showing an operation example of the third embodiment of the present invention.

FIG. 18 is a diagram showing an operation example of the circuit shown in FIG. 17. At first, both of the switch S1 and switch S2 are OFF (opened). The switch S1 is first turned ON. Thereby, though not illustrated, the capacitor CS shown in FIG. 17 is charged. When the charging is terminated, the switch S1 is turned OFF and the switch S2 is then turned ON. Therefore, current i5 flows from the capacitor CS. Note that, in FIG. 18, the current i5 is schematically illustrated to have a constant current value, but the total charge amount obtained by multiplying the current value by time influences the state after rewrite. In the present embodiment, since a charge amount (value) charged in the capacitor CS is utilized, fluctuation of the total amount of charge flowing in the memory cell at the rewrite time is reduced.

Figure 19:
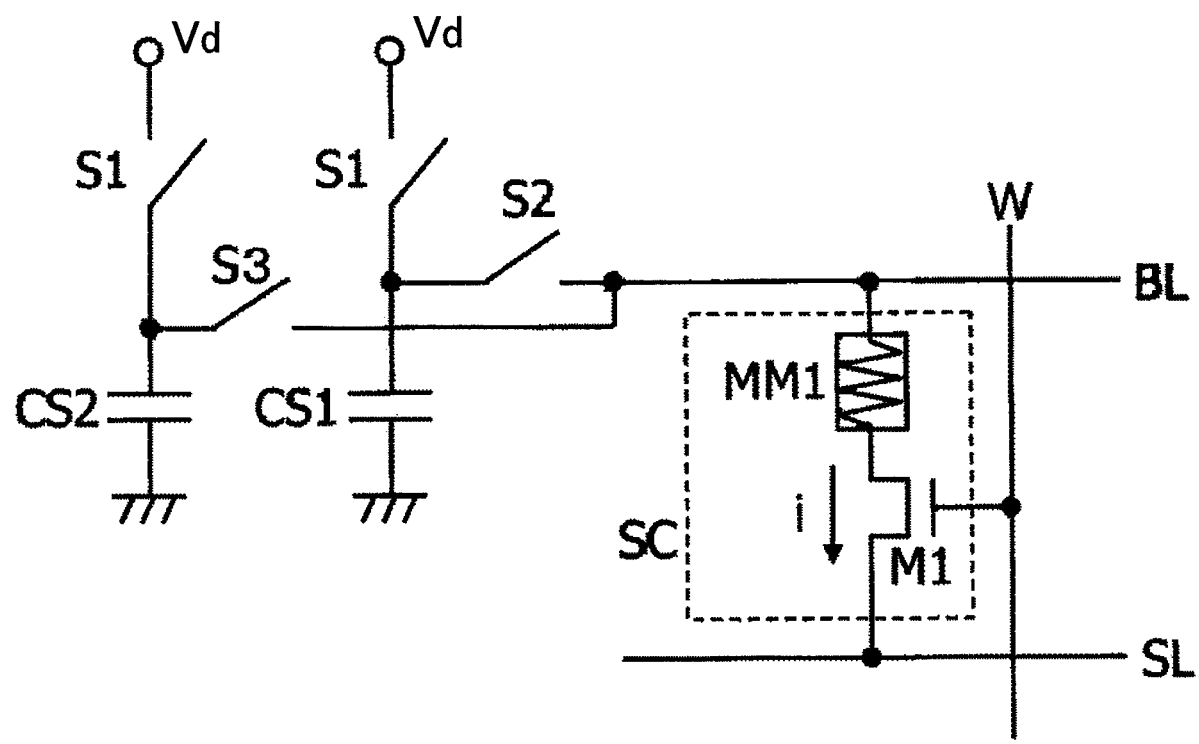
FIG. 19 is a diagram showing another configuration example of the third embodiment of the present invention.

FIG. 19 is a diagram showing another configuration example of the third embodiment of the present invention. In this configuration example, two kinds of capacitors CS1 and CS2 are prepared. Both the capacitors are precharged to Vd by the switch S1, and CS1 is connected to the bit line BL via S2 while CS2 is connected to the bit line BL via S3. When this configuration is used, a pre-pulse operation can be performed, and current for making the direction of spin at this time easily changeable can be realized by changing the capacitance CS1. Further, since the total amount of charge flowing in the memory cell at the rewrite time is based upon the charge charged on the capacitors CS1 and CS2, fluctuation is reduced. Incidentally, the capacitance value of CS1 is made smaller than that of CS2 in order to perform the pre-pulse operation.

Figure 20:
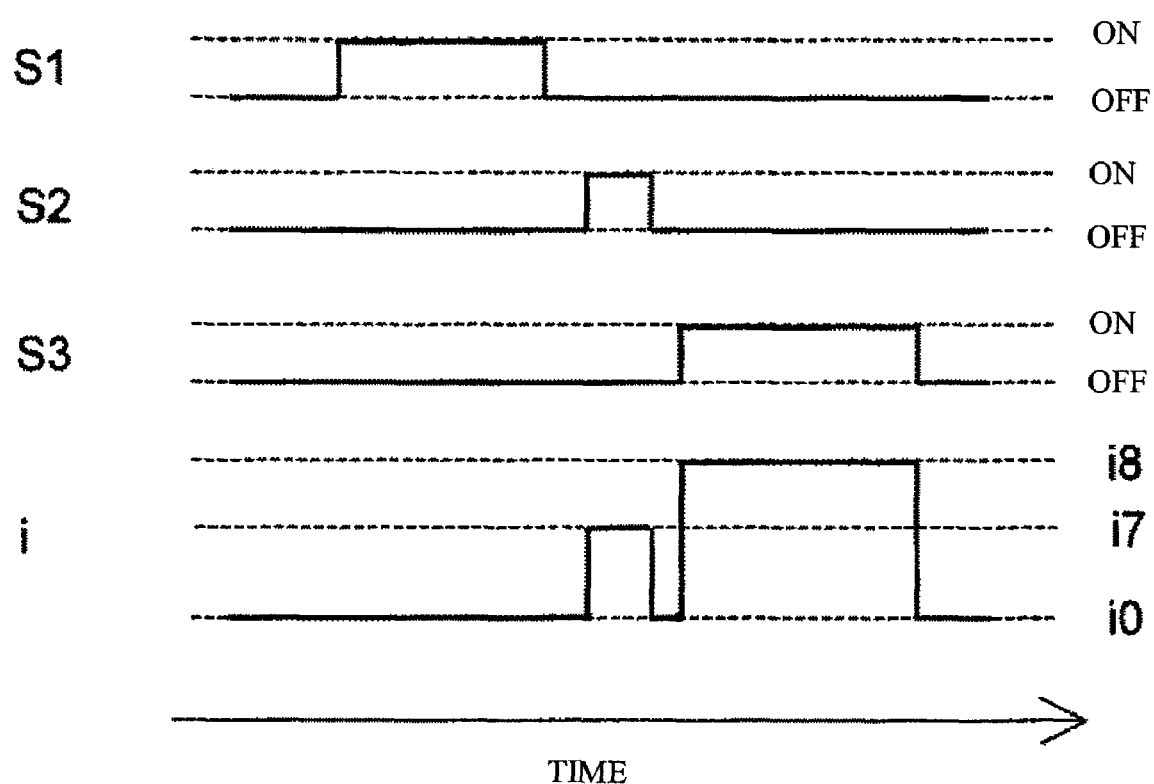
FIG. 20 is a diagram showing an operation example of the configuration example shown in FIG. 19.

FIG. 20 is a diagram showing an operation example of the circuit shown in FIG. 19, where CS1 and CS2 are both precharged by S1, and the memory cell and the capacitors are connected by S2 and S3 so that current is caused to flow in the memory cell. A pulse width of S2 is smaller than that of S3. Therefore, the pre-pulse operation can be imparted to the memory cell, so that the direction of spin can be easily changeable. Thereafter, rewrite current (charge) is provided by the switch S3. Incidentally, after the switch S2 is turned ON, when the switch S3 is turned ON before the switch S2 is turned OFF, the capacitor CS1 and the capacitor CS2 temporarily serve as loads simultaneously, so that a charge-drawing operation of the memory cell is made slow. Accordingly, when a control is made such that the pre-pulse and the rewrite pulse do not overlap with each other, the capacitor CS1 does not serve as a load, so that the memory cell can draw charge in the capacitor CS2 at high speed. Therefore, the pre-pulse and the rewrite pulse are not made continuous to each other in FIG. 20. However, time between the pre-pulse and the rewrite pulse is reduced (several ns or so), the effect of the pre-pulse can be obtained sufficiently. Incidentally, the switches S2 and S3 can be controlled such that the pre-pulse and the rewrite pulse are continuous to each other. In this case, an effect obtained by swinging spin by the pre-pulse can be utilized maximally. Note that, when the switch S2 is turned OFF during writing, part of charges accumulated on the capacitor CS1 and the capacitor CS2 are left. Therefore, when the pre-pulse and the rewrite pulse are made continuous to each other, it is preferable to make the switch S2 turned OFF after the writing is terminated.

Figure 21:
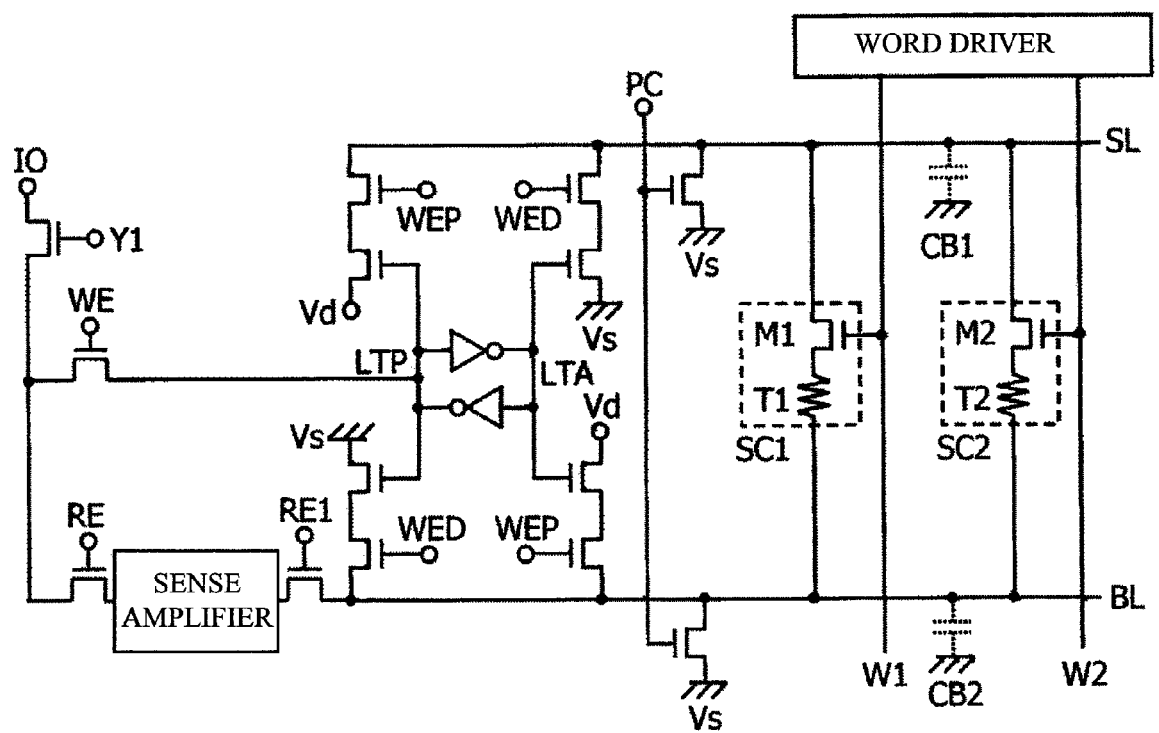
FIG. 21 is a diagram showing still another configuration example of the third embodiment of the present invention.

FIG. 21 is a diagram showing another configuration of the third embodiment of the present invention. A feature of this configuration lies in that the CS explained in FIG. 17 is configured utilizing parasitic capacitances CB1 and CB2 of the bit line BL and the source line SL. In order to realize an action for charging the parasitic capacitance preliminarily, a MOS transistor controlled by WEP is provided. The potential of the bit line BL or the source line SL is discharged to Vs by WED. Therefore, it becomes unnecessary to form the MOS capacitor or the MIM capacitor so that the area can be reduced. Incidentally, when the pre-pulse operation is simultaneously used, such a configuration can be adopted where the capacitor CS1 is formed using a parasitic capacitance and the capacitor CS2 is formed using a MOS capacitor or a MIM capacitor. In this case, since only the switch S3 connecting the bit line and the capacitor in FIG. 19 is required as the switch, the pre-pulse operation and the write operation are performed sequentially, so that an effect obtained by swinging spin by the pre-pulse can be utilized maximally.

Figure 22:
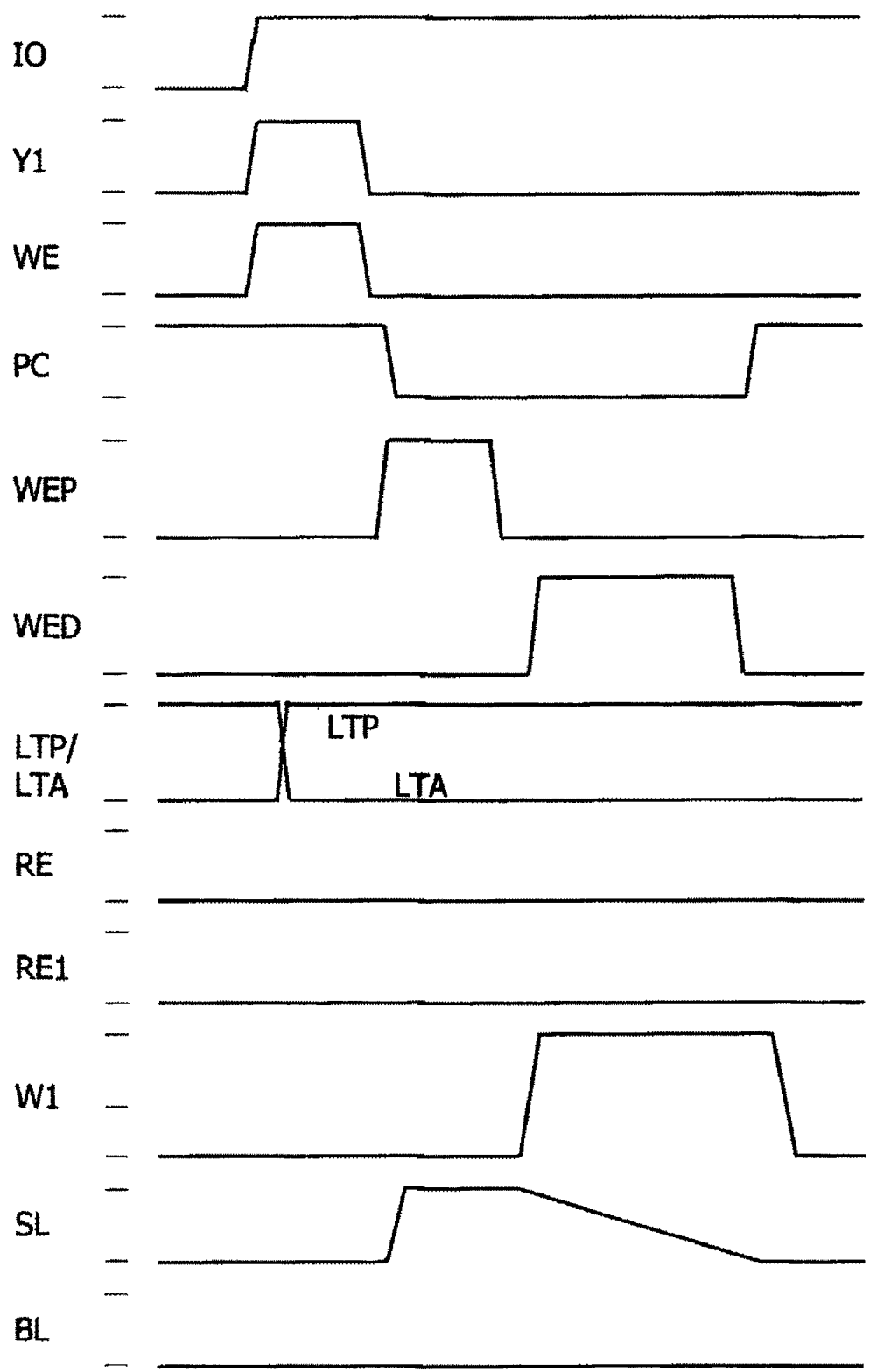
FIG. 22 is a diagram showing an operation example of the configuration example shown in FIG. 21.

FIG. 22 is a diagram showing an operation example of the configuration example shown in FIG. 21. After operations similar to those explained above, WEP is changed to high potential. Therefore, the SL designated by write data is charged. At this time, the SL includes a parasitic capacitance. Thereafter, WEP is returned back to low potential, the word line is selected and WED is changed to high potential. Consequently, charge accumulated on the parasitic capacitor of the source line SL flows into the memory cell. The capacitance of the source line (and the bit line) has fluctuation smaller than that of the performance of the memory cell transistors so that the capacitor can cause the constant charge to flow in the memory cell.

Figure 23:
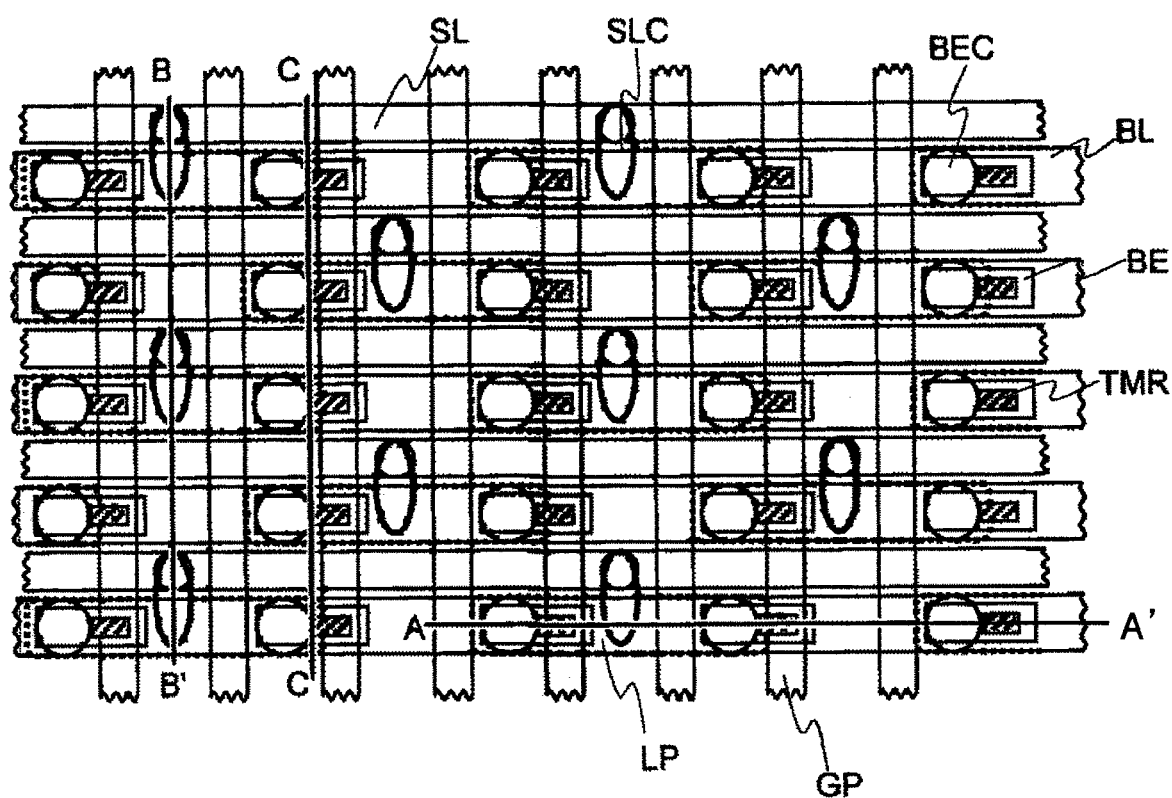
FIG. 23 is a layout diagram of a memory cell array for realizing an embodiment of the present invention.
Figure 24:
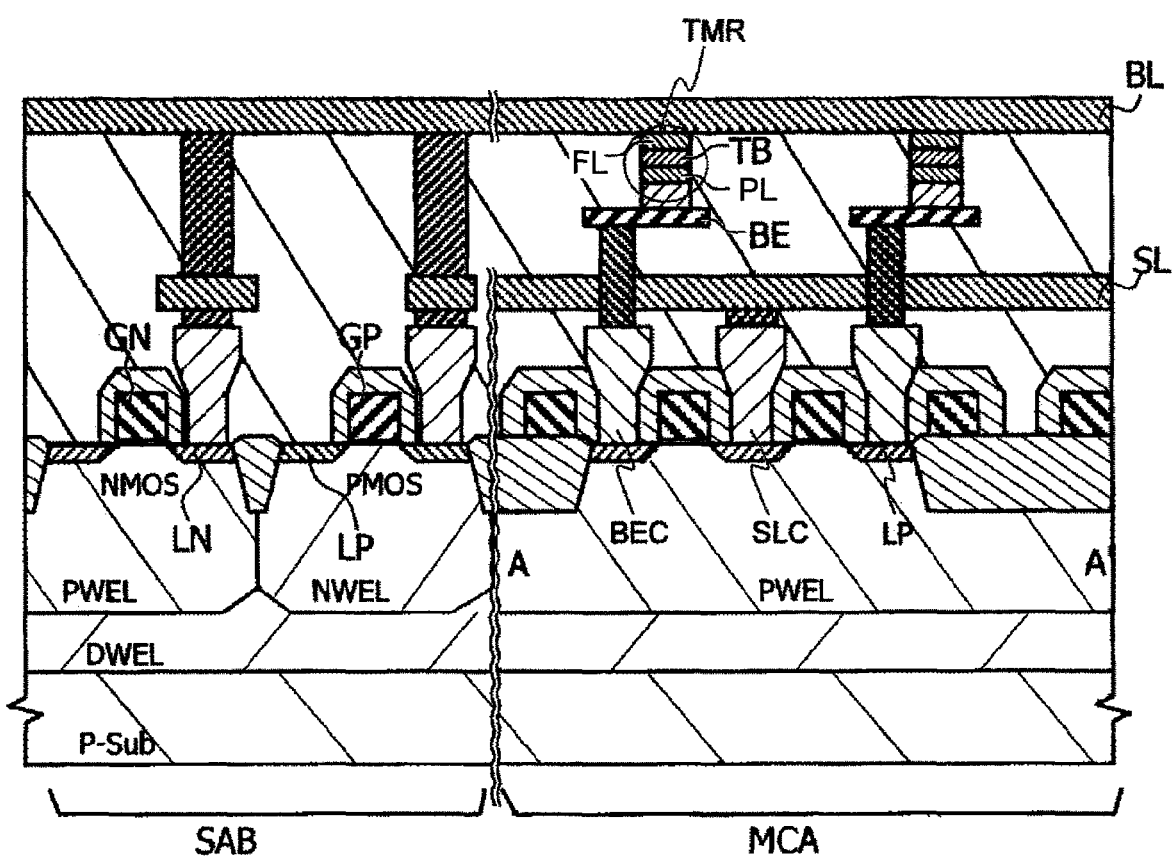
FIG. 24 is a sectional view of a portion of the memory cell array taken along line A-A' in FIG. 23 and a sectional view of a peripheral circuit thereof.
Figure 25:
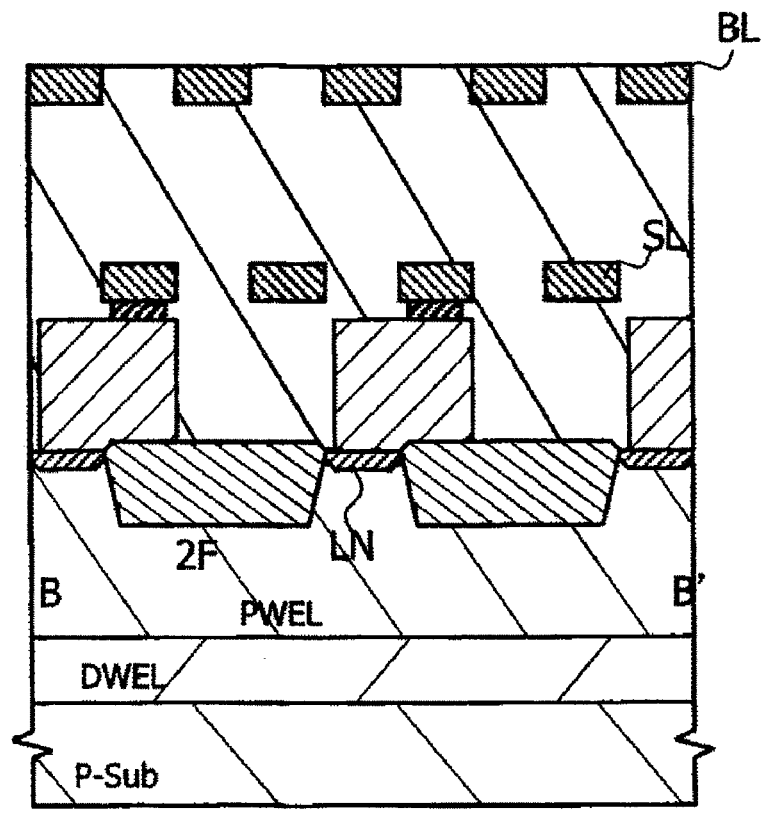
FIG. 25 is a sectional view of a portion of the memory cell array taken along line B-B' in FIG. 23 and a sectional view of a portion of the memory cell array taken along line C-C' in FIG. 23.
Figure 25:
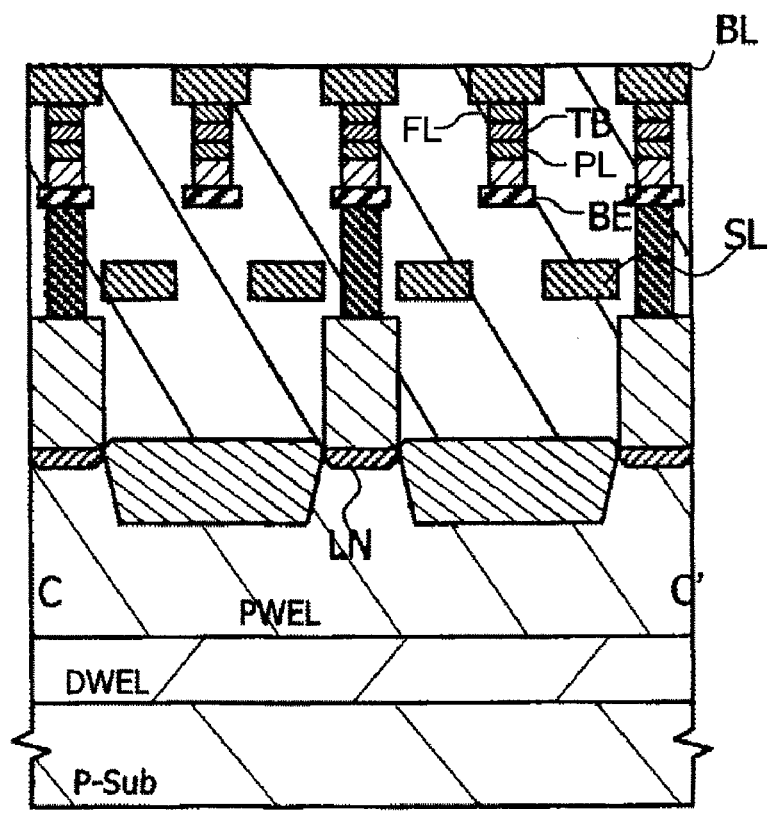

FIG. 23 is a diagram of a layout example of a memory cell array for realizing an embodiment of the present invention. The area of a memory cell array reaches $8F^2$ when a wiring pitch of the word line or the bit line is set to 2F. FIG. 24 shows a sectional view of a portion of the memory cell array taken along line A-A' in FIG. 23 and a peripheral circuit thereOf. FIG. 25 shows a sectional view of a portion of the memory cell array taken along line B-B' in FIG. 23 and a sectional view of a portion of the memory cell array taken along line C-C' in FIG. 23. A memory cell MC is composed of one NMOS transistor and a tunneling magnetoresistance TMR. A word line WL is connected to a gate GP of the transistor. Gate material is p-type polysilicon or it is reduced in resistance by stacking silicide or tungsten (W) on an upper portion of p-type polysilicon. A memory cell transistor is formed in a p-type semiconductor region PWEL. The p-type semiconductor region PWEL is formed in an n-type semiconductor region DWEL, and the DWEL is formed on a P-Sub. A source line contact SLC is disposed on one of diffusion layers LN of an n-MOS transistor. The source line contact is shared by adjacent memory cell MC so that the area is reduced. A source line is disposed on the source line contact in a direction perpendicular to the word line. A bottom electrode contact BEC connected to the tunneling magnetoresistance TMR is disposed on the diffusion layer LP where the source line contact is not disposed. The bottom electrode contact BEC is connected to a bottom electrode BE disposed with the tunneling magnetoresistance. The tunneling magnetoresistance TMR composed of a plurality of magnetic films and a tunneling film is disposed on the bottom electrode BE. The tunneling magnetoresistance TMR includes at least one tunneling film TB, and a fixed layer PL and a free layer FL disposed on the sides of the tunneling film TB are contained. The direction of spin of electrons in the fixed layer PL which is a magnetic body is fixed in one direction. The direction of spin in the free layer FL which is a magnetic body is put in either one of two states of a parallel state and an anti-parallel state to the fixed layer. In the present configuration, the fixed layer PL is disposed between the tunneling film TB and the bottom electrode, and the free layer FL is disposed between the bit line BL disposed above the tunneling magnetoresistance TMR and the tunneling film TB. The bit line is disposed to be perpendicular to the word line and in parallel with the source line. The tunneling magnetoresistance TMR is formed in a rectangular shape or an oval shape such that its bit line disposition direction is longer than the word line disposition direction. In this manner, an advantage can be obtained by adopting the horizontal length and the vertical length different from each other, that magnetic anisotropy appears where the free layer is hard to be magnetized in a direction other than the parallel state and the anti-parallel state, so that retaining characteristic of the spin direction in the free layer FL is improved.

Figure 26:
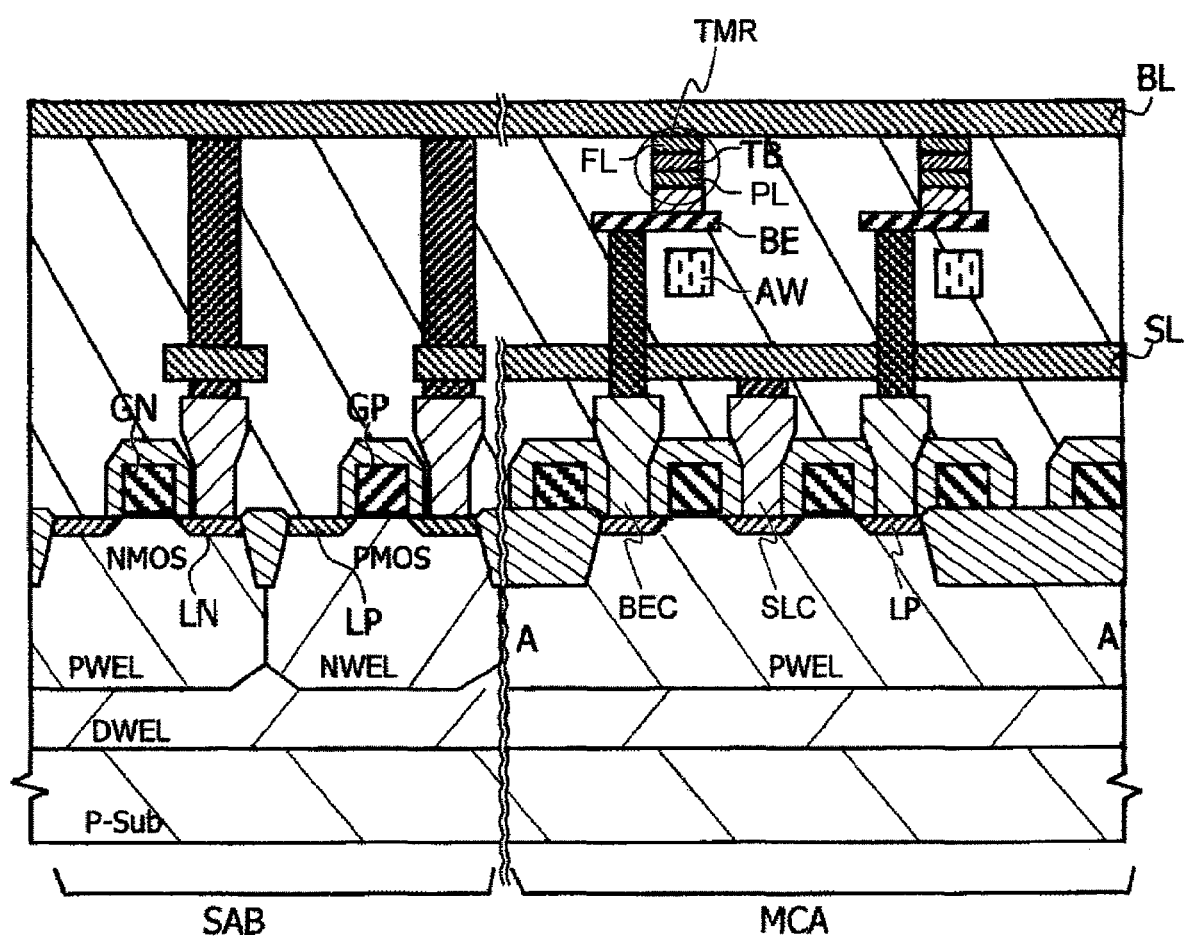
FIG. 26 is a layout view of a memory cell array showing a fourth embodiment of the present invention.

FIG. 26 is a diagram of a layout example of a memory cell array showing a fourth embodiment of the present invention. FIG. 26 shows only a portion corresponding to FIG. 24. A feature of the embodiment lies in that an assist word line AW running in parallel with the word line is disposed below the bottom electrode BE. By causing current to flow in the assist word line AW, a magnetic field can be generated, so that it can influence the operation of the TMR device.

Figure 27A:
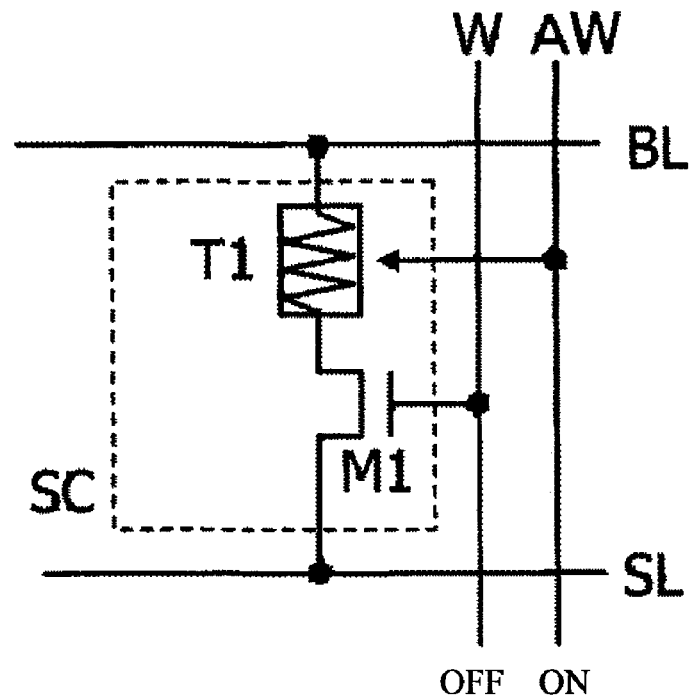
FIG. 27A is a circuit diagram corresponding to the memory cell having the sectional structure shown in FIG. 26.
Figure 27B:
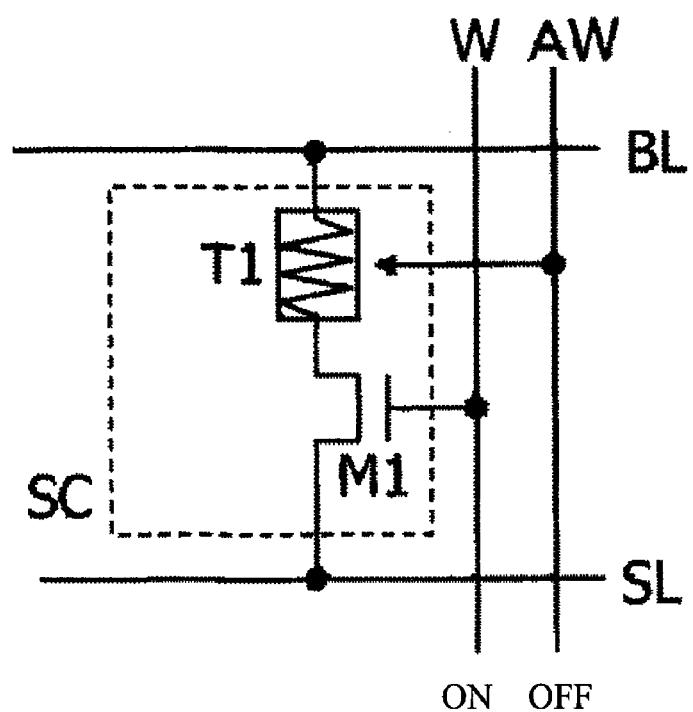
FIG. 27B is a circuit diagram corresponding to the memory cell having the sectional structure shown in FIG. 26.

FIG. 27 is circuit diagrams corresponding to the memory cell of the sectional structure shown in FIG. 26. The word line W and the assist word line AW are arranged in parallel, and it is indicated by an arrow that the assist word line AW can influence the TMR device T1 by the magnetic field generated by current flowing in the assist word line. As the operation example, there are examples shown by FIG. 27A and FIG. 27B. More specifically, only the assist word line is first turned ON to cause current to flow, as shown in FIG. 27A. Therefore, the direction of spin in T1 can be made easily changeable by the magnetic field actually generated. In the next operation in FIG. 27B, the word line is turned ON to cause rewrite current to flow. Since the spin has already been put in the easily reversible state by the action of the assist word line AW, rewrite can be performed with less amount of current. However, when current is only flowed in the assist word line, spin is put in the easily reversible state but the spin immediately returns back to its original state.

Figure 28:
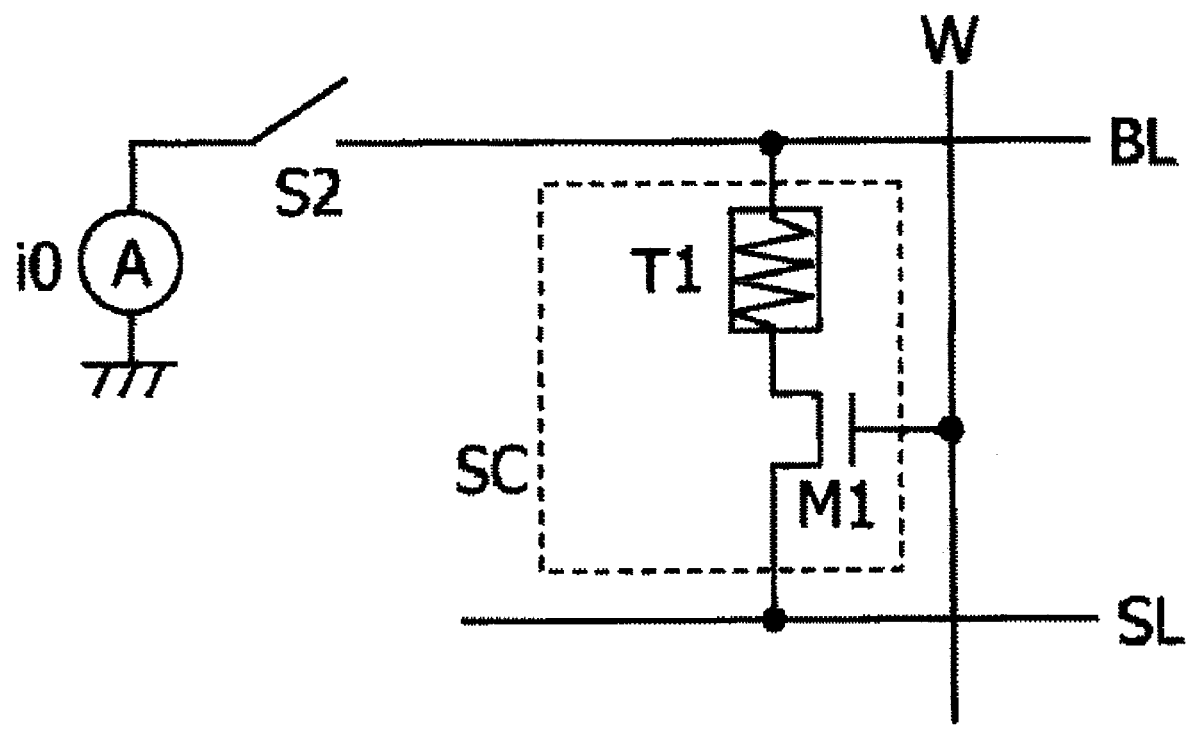
FIG. 28 is a diagram showing another configuration example of the fourth embodiment of the present invention.
Figure 29A:
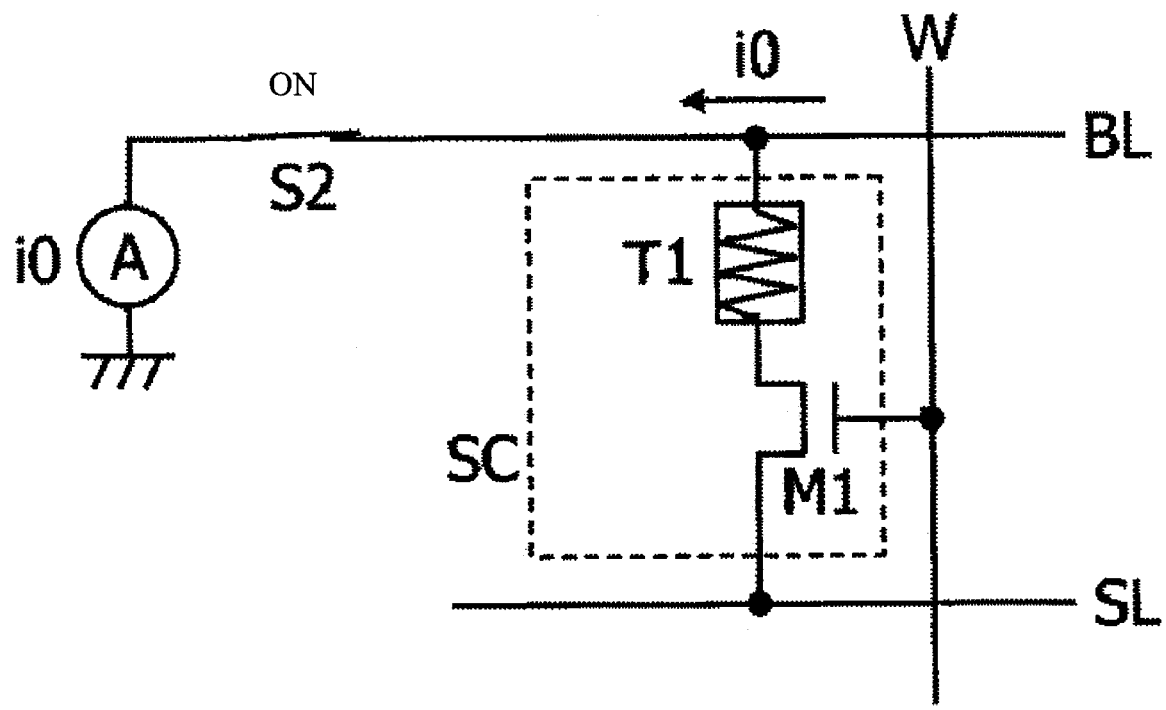
FIG. 29A is a diagram of an operation example of the configuration example shown in FIG. 28.
Figure 29B:
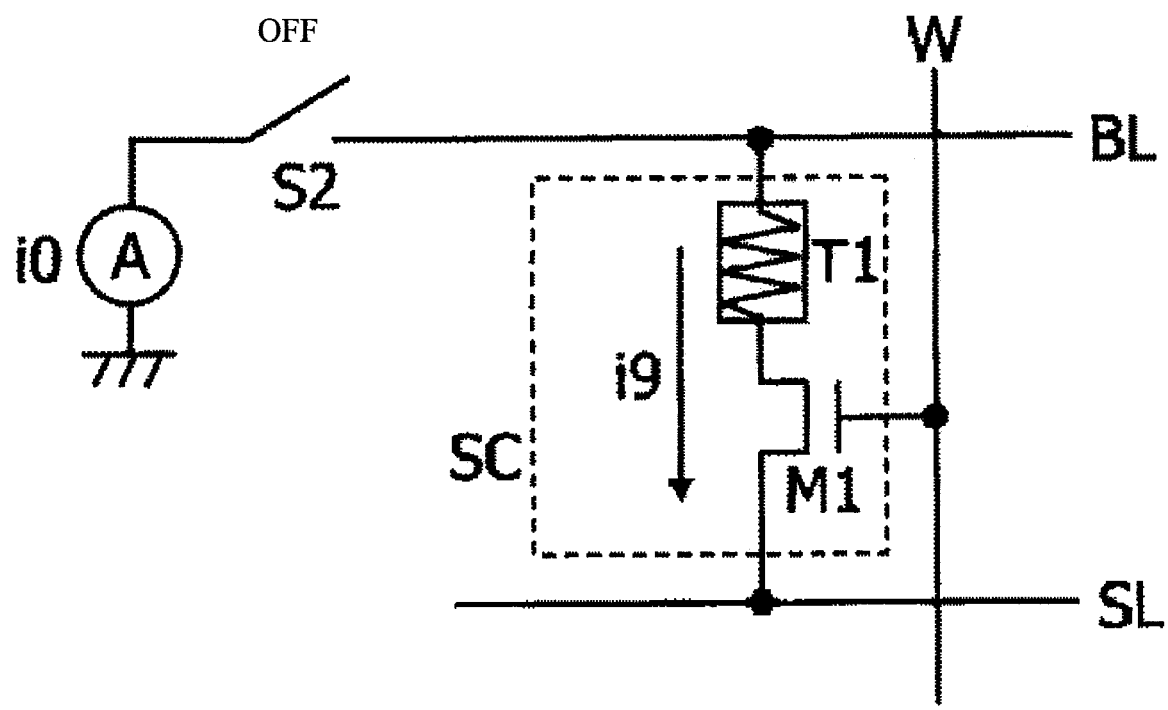
FIG. 29B is a diagram of an operation example of the configuration example shown in FIG. 28.

Such an operation can be realized by another method instead of the structure shown in FIG. 26. This is shown as another configuration example of the fourth embodiment of the present invention in FIG. 28. A configuration is sufficient where a switch S2 is provided between the bit line BL and the current source i0 are adopted in this manner. Its operation example is shown in FIG. 29. As shown in FIG. 29A, S2 is first turned ON to cause current i0 to flow. Therefore, a magnetic field is generated on the bit line BL. According to FIG. 24 which is a sectional view, the bit line is disposed to be connected to the TMR device. Therefore, the TMR device is influenced by the magnetic field, so that spin is made easily reversible. Next, the switch S2 is turned OFF as shown in FIG. 29B, and the word line W is activated so that rewrite current i9 is caused to flow. Since the spin is put in the easily reversible state by the action in FIG. 29A, rewriting can be performed with less amount of current. However, when the switch S2 is only turned OFF after the action in FIG. 29A, the TMR device immediately returns back to its original state.

In the foregoing, though the present invention has been explained based on the embodiments, various modifications to the present invention can be made within the scope and spirit of the present invention.

What is claimed is:

1. A semiconductor device comprising:
a plurality of word lines;
a plurality of bit lines arranged in a direction crossing the word lines; and
a plurality of memory cells disposed at predetermined crossing points of the word lines and the bit lines,
wherein each of the plurality of memory cells has a tunneling magnetoresistance obtained by stacking a fixed layer, a tunneling film, and a free layer, and a MOSFET whose gate is connected to the word line and whose drain is connected to one end of the tunneling magnetoresistance,
the fixed layer is disposed neighboring the tunneling film, where a direction of electron spin is fixed in a predetermined direction,
the free layer is disposed neighboring a surface opposite to a surface of the tunneling film neighboring the fixed layer, where a direction of electron spin takes either one of a parallel state and an anti-parallel state to the fixed layer,
the spin in the free layer writes information utilizing spin transfer torque, and
at a write operation time to write one piece of information into the tunneling magnetoresistance, after a first current is caused to flow in the tunneling magnetoresistance, a second current larger than the first current is caused to flow therein.

2. The semiconductor device according to claim 1, wherein a voltage applied to the word line when the first current is caused to flow in the tunneling magnetoresistance is smaller than a voltage applied to the word line when the second current is caused to flow in the tunneling magnetoresistance.

3. The semiconductor device according to claim 1, wherein a voltage applied to the bit line when the first current is caused to flow in the tunneling magnetoresistance is smaller than a voltage applied to the bit line when the second current is caused to flow in the tunneling magnetoresistance.

4. A semiconductor device comprising:
a plurality of word lines;
a plurality of bit lines arranged in a direction crossing the word lines; and
a plurality of memory cells disposed at predetermined crossing points of the word lines and the bit lines,
wherein the memory cell has a tunneling magnetoresistance having a tunneling film, a fixed layer, and a free layer, and a MOSFET whose gate is connected to the word line and whose drain is connected to the fixed layer side of the tunneling magnetoresistance,
the fixed layer is disposed neighboring the tunneling film, where a direction of electron spin is fixed in a predetermined direction,
the free layer is disposed neighboring a surface opposite to a surface of the tunneling film neighboring the fixed layer, where a direction of electron spin takes either one of a parallel state and an anti-parallel state to the fixed layer,
the spin in the free layer rewrites information utilizing spin transfer torque, and
a time period for causing current to flow in the memory cell at a read operation time is shorter than a time period for causing current to flow in the memory cell at a rewrite operation time, and values of both the currents are approximately the same.

5. The semiconductor device according to claim 4, wherein, before the rewrite operation, a current weaker than a current required for rewrite is caused to flow.

6. The semiconductor device according to claim 4, wherein, at the read operation time, a bit line voltage is kept constant in a source-follower mode.

7. A semiconductor device comprising:
a word line;
a bit line disposed in a direction crossing the word line;
a memory cell disposed at a predetermined crossing point of the word line and the bit line;
a first switch connected to the bit line;
a first capacitor connected to the first switch; and
a second switch connected between the first capacitor and a first potential,
wherein the memory cell has a tunneling magnetoresistance obtained by stacking a fixed layer, a tunneling film, and a free layer, and a MOSFET whose gate is connected to the word line and whose drain is connected to the fixed layer side of the tunneling magnetoresistance,
the fixed layer is disposed neighboring the tunneling film, where a direction of electron spin is fixed in a predetermined direction,
the free layer is disposed neighboring a surface opposite to a surface of the tunneling film neighboring the fixed layer, where a direction of electron spin takes either one of a parallel state and an anti-parallel state to the fixed layer,
the spin in the free layer rewrites information utilizing spin transfer torque, and
when the memory cell is rewritten, after the second switch is turned ON to charge the first capacitor, charge charged in the first capacitor is caused to flow in the memory cell by turning OFF the second switch and turning ON the first switch.

8. The semiconductor device according to claim 7, further comprising:
a third switch connected to the bit line;
a second capacitor connected to the third switch and having a capacitance smaller than that of the first capacitor;
a fourth switch connected between the second capacitor and the first potential,
wherein, after the fourth switch is turned ON to charge the second capacitor before the first switch is turned ON, the third switch is turned ON to cause charge charged in the second capacitor to flow in the memory cell.

9. The semiconductor device according to claim 7,
wherein the first capacitor is a parasitic capacitance of the bit line.

10. A semiconductor device comprising:
a word line;
a bit line disposed in a direction crossing the word line; and
a memory cell disposed at a crossing point of the word line and the bit line,
wherein the memory cell has a tunneling magnetoresistance having a tunneling film, a fixed layer, and a free layer, and a MOSFET whose gate is connected to the word line and whose drain is connected to the fixed layer side of the tunneling magnetoresistance,
the fixed layer is disposed neighboring the tunneling film, where a direction of electron spin is fixed in a predetermined direction,
the free layer is disposed neighboring a surface opposite to a surface of the tunneling film neighboring the fixed layer, where a direction of electron spin takes either one of a parallel state and an anti-parallel state to the fixed layer,
the spin in the free layer rewrites information utilizing spin transfer torque, and
a metal wire is disposed near the free layer in parallel with the word line, and a magnetic field influencing the free layer is generated by causing current to flow in the metal wire before a rewrite operation.

11. A semiconductor device comprising:
a word line;
a bit line disposed in a direction crossing the word line; and
a memory cell disposed at a crossing point of the word line and the bit line,
wherein the memory cell has a tunneling magnetoresistance having a tunneling film, a fixed layer, and a free layer, and a MOSFET whose gate is connected to the word line and whose drain is connected to the fixed layer side of the tunneling magnetoresistance,
the fixed layer is disposed neighboring the tunneling film, where a direction of electron spin is fixed in a predetermined direction,
the free layer is disposed neighboring a surface opposite to a surface of the tunneling film neighboring the fixed layer, where a direction of electron spin takes either one of a parallel state and an anti-parallel state to the fixed layer,
the spin in the free layer rewrites information utilizing spin transfer torque, and
before a rewrite operation, a magnetic field influencing the free layer is generated by causing current to flow in the bit line.

* * * * *